United States Patent
Nguyen et al.

(10) Patent No.: US 8,014,130 B1
(45) Date of Patent: Sep. 6, 2011

(54) PEN-LIKE UNIVERSAL SERIAL BUS (USB) FLASH DRIVE WITH DEPLOYING AND RETRACTING FUNCTIONALITIES

(75) Inventors: David Nguyen, San Jose, CA (US); Nan Nan, San Jose, CA (US); Abraham C. Ma, Fremont, CA (US); Jim Chin-Nan Ni, San Jose, CA (US); Charles Chung Lee, Cupertino, CA (US); Ming-Shiang Shen, Taipei (TW)

(73) Assignee: Super Talent Electronics, Inc., San Jose, CA (US)

( * ) Notice: Subject to any disclaimer, the term of this patent is extended or adjusted under 35 U.S.C. 154(b) by 886 days.

(21) Appl. No.: 11/950,190

(22) Filed: Dec. 4, 2007

Related U.S. Application Data

(63) Continuation-in-part of application No. 11/682,261, filed on Mar. 5, 2007, now Pat. No. 7,420,803, and a continuation-in-part of application No. 11/466,759, filed on Aug. 23, 2006, now Pat. No. 7,702,831, which is a continuation-in-part of application No. 10/789,333, filed on Feb. 26, 2004, now Pat. No. 7,318,117, and a continuation-in-part of application No. 11/112,501, filed on Apr. 21, 2005, now Pat. No. 7,269,004.

(51) Int. Cl.
*H02B 1/00* (2006.01)
(52) U.S. Cl. ............... 361/600; 361/679.31; 361/752; 361/753; 361/737; 439/131
(58) Field of Classification Search ............ 361/679.31, 361/752, 755, 737; 439/131
See application file for complete search history.

(56) References Cited

U.S. PATENT DOCUMENTS

| | | | |
|---|---|---|---|
| 5,623,552 | A | 4/1997 | Lane |
| 5,907,856 | A | 5/1999 | Estakhri et al. |
| 5,959,541 | A | 9/1999 | DiMaria et al. |
| 6,000,006 | A | 12/1999 | Bruce et al. |
| 6,012,636 | A | 1/2000 | Smith |
| 6,069,920 | A | 5/2000 | Schulz et al. |
| 6,081,858 | A | 6/2000 | Abudayyeh et al. |
| 6,125,192 | A | 9/2000 | Bjorn et al. |
| 6,193,152 | B1 | 2/2001 | Fernando et al. |
| 6,202,138 | B1 | 3/2001 | Estakhri et al. |
| 6,230,233 | B1 | 5/2001 | Lofgren et al. |
| 6,275,894 | B1 | 8/2001 | Kuo et al. |
| 6,321,478 | B1 | 11/2001 | Klebes |
| 6,547,130 | B1 | 4/2003 | Shen |
| 6,636,929 | B1 | 10/2003 | Frantz et al. |
| 6,718,407 | B2 | 4/2004 | Martwick |
| 6,880,024 | B2 | 4/2005 | Chen et al. |

(Continued)

*Primary Examiner* — Yuriy Semenenko
*Assistant Examiner* — Andargie M Aychillhum
(74) *Attorney, Agent, or Firm* — Blakely Sokoloff Taylor & Zafman LLP

(57) ABSTRACT

Various embodiments of a USB drive pen device are disclosed herein. In one embodiment, a USB drive pen device includes a USB plug assembly having a flash controller and a flash memory device, a pusher assembly including a rotator having one or more tabs disposed thereon, and a housing for housing at least a portion of the USB plug assembly and the pusher assembly. The housing includes a tunnel and an inner tube extended from the tunnel disposed within the housing. An intersection between the tunnel and inner tube includes one or more angled corners to lock the USB plug assembly in either a deployed position or a retracted position. Other methods and apparatuses are also described.

23 Claims, 28 Drawing Sheets

U.S. PATENT DOCUMENTS

| | | |
|---|---|---|
| 7,004,780 B1 * | 2/2006 | Wang .......................... 439/353 |
| 7,095,617 B1 * | 8/2006 | Ni .............................. 361/736 |
| 7,103,765 B2 | 9/2006 | Chen |
| 7,249,978 B1 * | 7/2007 | Ni .............................. 439/660 |
| 7,257,714 B1 | 8/2007 | Shen |
| 2001/0043174 A1 | 11/2001 | Jacobsen et al. |
| 2002/0166023 A1 | 11/2002 | Nolan et al. |
| 2003/0046510 A1 | 3/2003 | North |
| 2003/0163656 A1 | 8/2003 | Ganton |
| 2004/0148482 A1 | 7/2004 | Grundy et al. |
| 2004/0255054 A1 | 12/2004 | Pua et al. |
| 2005/0102444 A1 | 5/2005 | Cruz |
| 2005/0120146 A1 | 6/2005 | Chen et al. |
| 2005/0160213 A1 | 7/2005 | Chen |
| 2005/0193161 A1 | 9/2005 | Lee et al. |
| 2005/0246243 A1 | 11/2005 | Adams et al. |
| 2005/0268082 A1 | 12/2005 | Poisner |
| 2006/0065743 A1 | 3/2006 | Fruhauf |
| 2006/0075174 A1 | 4/2006 | Vuong |
| 2006/0106962 A1 | 5/2006 | Woodbridge et al. |
| 2006/0161725 A1 | 7/2006 | Lee et al. |
| 2006/0206702 A1 | 9/2006 | Fausak |
| 2006/0242395 A1 | 10/2006 | Fausak |
| 2007/0094489 A1 | 4/2007 | Ota et al. |
| 2007/0113067 A1 | 5/2007 | Oh et al. |
| 2007/0113267 A1 | 5/2007 | Iwanski et al. |
| 2007/0130436 A1 | 6/2007 | Shen |

* cited by examiner

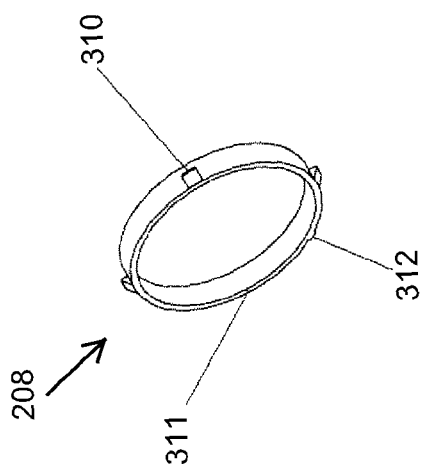
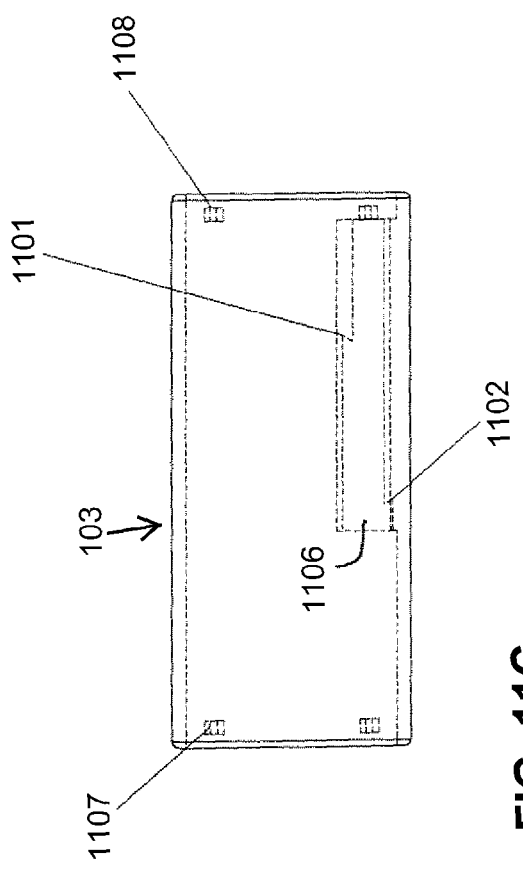
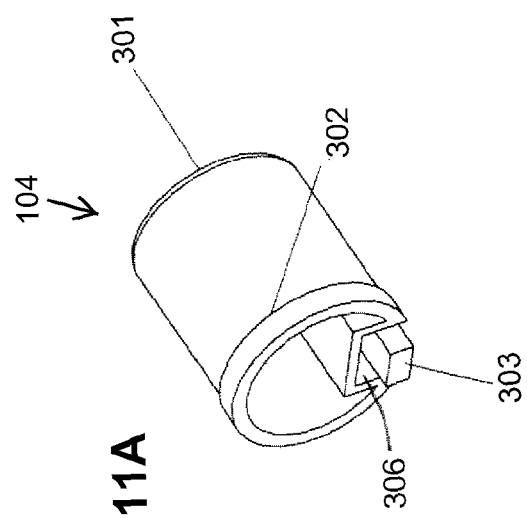
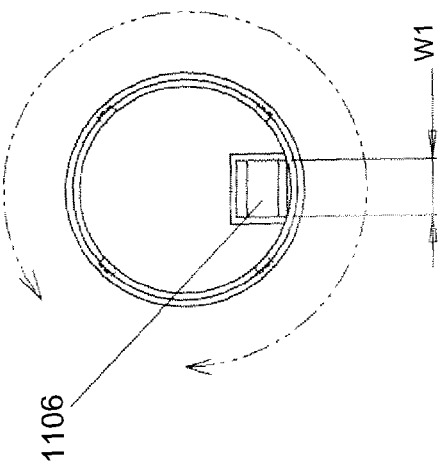
FIG. 11A  FIG. 11B  FIG. 11C

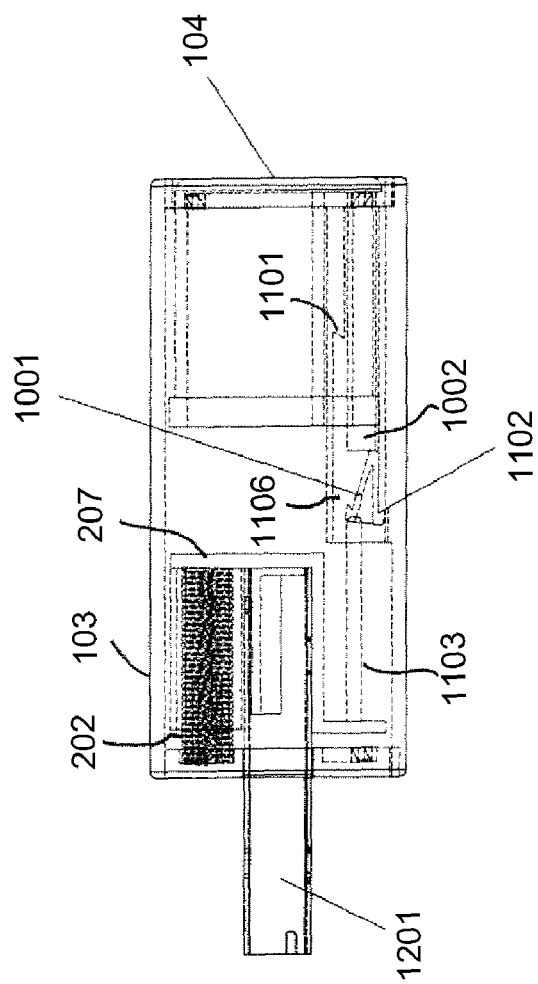

PEN-LIKE UNIVERSAL SERIAL BUS (USB) FLASH DRIVE WITH DEPLOYING AND RETRACTING FUNCTIONALITIES

RELATED APPLICATIONS

This application is a continuation in part CIP of co-pending U.S. patent application Ser. No. 11/682,261, filed Mar. 5, 2007, entitled "Universal Serial Bus Flash Drive with Deploying and Retracting Functionalities", and a CIP of U.S. patent application Ser. No. 11/466,759, filed on Aug. 23, 2006, entitled "Flash Memory Controller for Electronic Data Flash Card", which is a CIP of U.S. patent application Ser. No. 10/789,333, filed on Feb. 26, 2004, entitled "System and Method for Controlling Flash Memory", now abandoned, and which is a CIP of U.S. patent application Ser. No. 11/112,501, filed on Apr. 21, 2005, entitled "Low-profile USB Device" all of which are incorporated herein by reference as though set forth in full.

FIELD OF THE INVENTION

The present invention relates generally to universal serial bus (USB) flash drives and particularly to a method and apparatus for designing USB flash drives having pen-like configuration with deploying and retracting functionalities.

BACKGROUND

As computers have gained enormous popularity in recent decades, so has the need for better and more efficient ways of storing memory. Notable among memory devices are the portable ones that may be carried around by the user to access computers at different locations. This is particularly common in the case of personal computers (PC) where the need often arises to transfer data from one PC to another. Examples of portable memory devices include nonvolatile memory devices such as a universal serial bus (USB) flash drive that is removably connectible to a computer.

Universal serial bus (USB) flash drives are available in various shapes and forms. The USB flash drive needs a USB plug connector to be coupled to a USB port of a host device such as a PC. The USB flash drive generally has a metal casing and a cover which is screwed in or otherwise attached to the casing. To access the USB plug connector the user needs to open the metal cover and put it back on the casing after finishing the work with the USB flash drive. The shape of the casing and cover may be in the form of a pen or some other configuration.

However, use of the metallic parts such as the casing and the cover generally results in a heavy USB flash drive which is not very convenient to carry. The dimensions of the casing and cover are often large resulting in a long USB flash drive which is another impediment to easy carriage of the unit. In addition, once the cover is removed, it may be lost or simply forgotten to be put back on the casing.

It is therefore desirable to design and develop a USB flash drive with a relatively short and compact configuration that is light and may therefore be easily carried around by the user. In addition, the desired USB flash drive should not incur substantial cost of manufacturing but should rather improve the manufacturing and assembly process over the existing USB flash drives with metallic components.

SUMMARY OF THE DESCRIPTION

Various embodiments of a USB drive pen device are disclosed herein. In one embodiment, a USB drive pen device includes a USB plug assembly having a flash controller and a flash memory device, a pusher assembly including a rotator having one or more tabs disposed thereon, and a housing for housing at least a portion of the USB plug assembly and the pusher assembly. The housing includes a tunnel and an inner tube extended from the tunnel disposed within the housing. An intersection between the tunnel and inner tube includes one or more angled corners to lock the USB plug assembly in either a deployed position or a retracted position.

Other features of the present invention will be apparent from the accompanying drawings and from the detailed description which follows.

BRIEF DESCRIPTION OF THE DRAWINGS

The present invention is illustrated by way of example and not limitation in the figures of the accompanying drawings in which like references indicate similar elements.

FIGS. 11A-11F are diagrams showing certain components of a USB drive pen device according to certain embodiments.

FIGS. 14A-14B show a USB drive pen device in a deployed and retracted modes according to another embodiment.

DETAILED DESCRIPTION

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Figure 1:
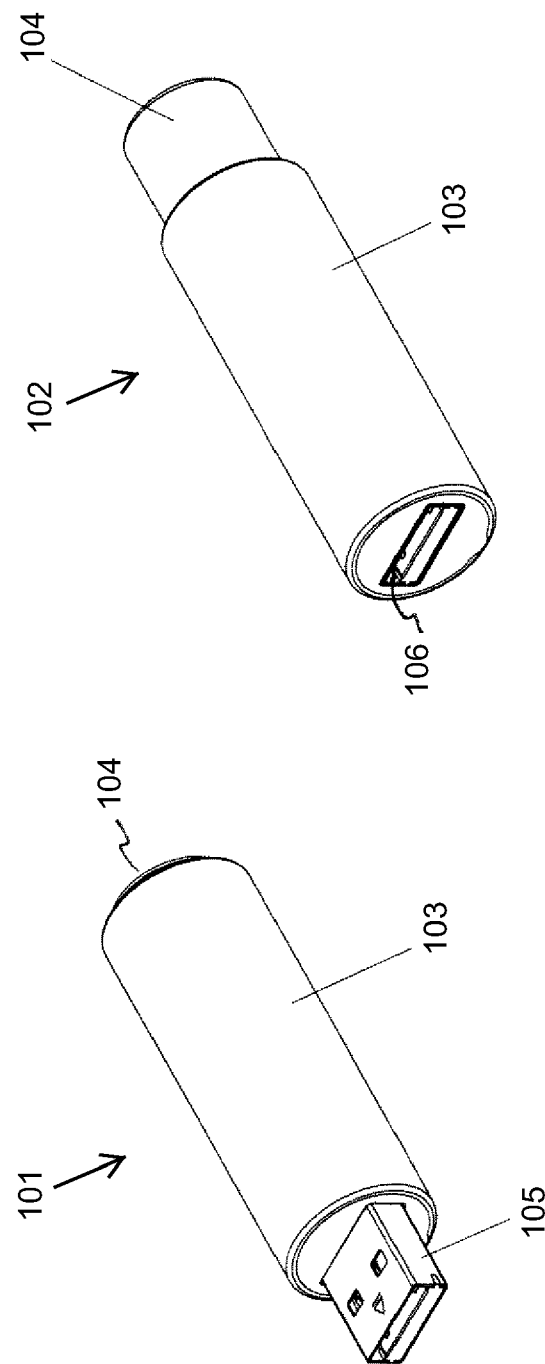
FIG. 1 is a diagram showing a USB drive pen device in a perspective view according to one embodiment.

According to certain embodiments of the invention, a universal serial bus (USB) flash drive pen device includes functionalities for deploying and retracting a USB plug connector, including a pusher assembly having a USB flash drive and a USB plug connector. FIG. 1 is a diagram illustrating a perspective view of a pen-shape USB drive device according to one embodiment of the invention. Referring now to FIG. 1, a USB flash drive pen device is shown in a deployed configuration 101 and a retracted configuration 102. In one embodiment, the USB flash drive includes a housing unit 103, a USB plug connector 105, and an end button 104. The housing 103 may be implemented in a longitudinal tubular or a cylindrical shape. The housing unit 103 may be used to enclose a USB flash drive which is coupled to the USB plug connector 105, which may be a standard USB plug connector and/or an extended USB plug connector. The flash drive enclosed within the housing 103 may be implemented in various configurations, such as, for example a printed circuit board assembly (PCBA), a chip-on-board (COB) package, and/or an ultra-thin USB package, etc. Housing 103 includes a first end having an opening or slot through which USB plug connector may be extended or retracted and a second end through which the end button 104 may be pushed or popped. During a retracted mode 102, the USB plug connector 105 is inside the opening 106 and enclosed by the housing 103, where button 104 is popped out at a second end of the housing 103. When button 104 is pushed from the retracted mode 102, the USB drive is in a deployed mode, where the USB plug connector 105 is deployed as being pushed out through the opening 106. As a result, the USB plug connector 105 may be coupled to any USB port. From the deployed mode 101, when the button 104 is pressed again, the USB plug connector 105 is retracted and the USB drive is back in a retracted mode 102.

The housing 103 is shown to be cylindrical for the purposes of illustration, but in other embodiments of the invention the housing may have other cross sections such as square or rectangle or the casing may be cylindrical with varying diameter along the length such as smaller diameter in the middle to provide a better grip for handling. In the retracted position, the USB flash drive pen device may be carried in a pocket without having the risk of damaging the USB plug connector 105 and may be redeployed as desired.

Figure 2:
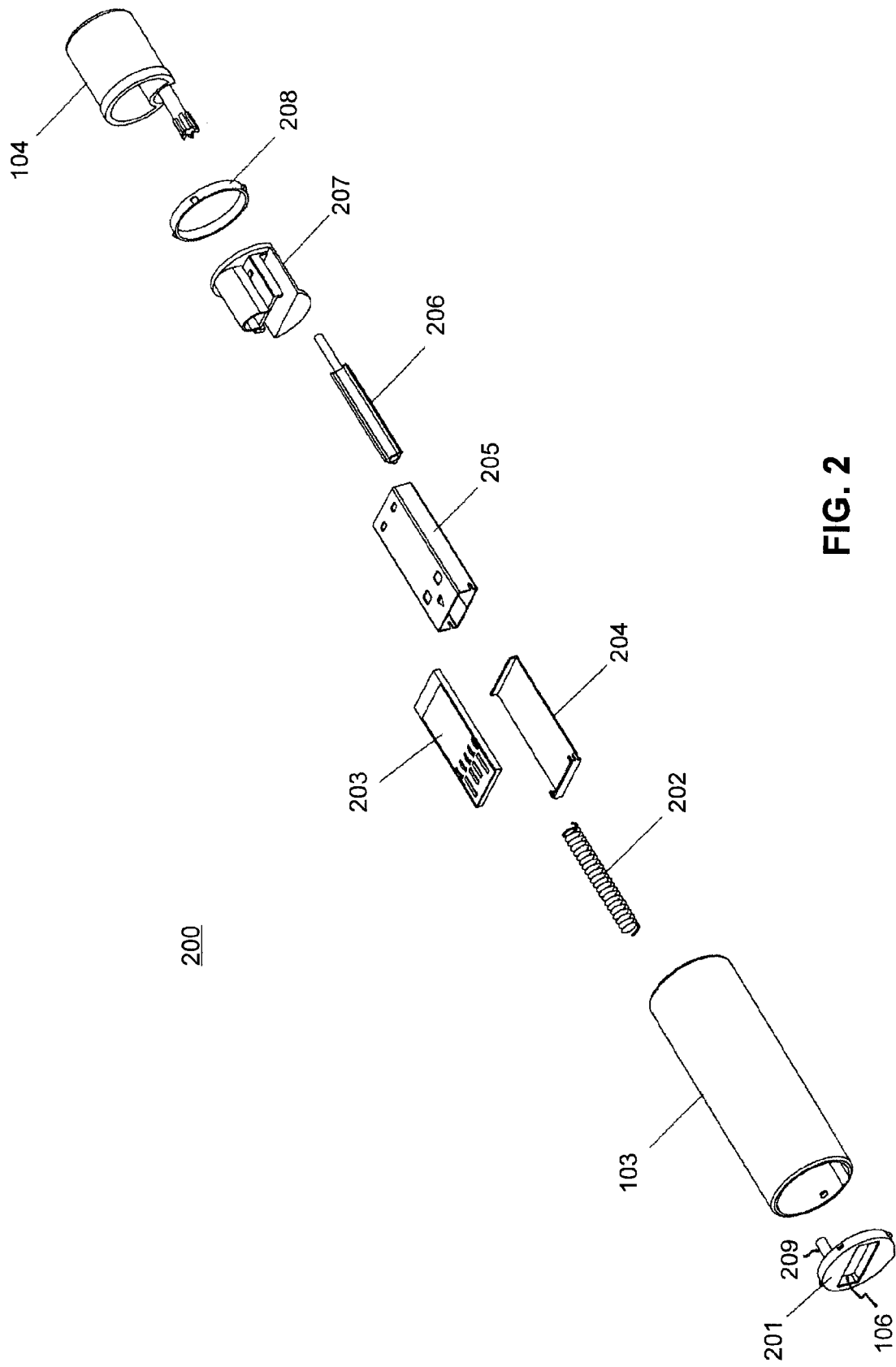
FIG. 2 is a diagram showing a USB drive pen device in an exploded view according to one embodiment.

FIG. 2 is a diagram illustrating an exploded perspective view of a USB pen drive according to one embodiment of the invention. For example, pen-shape USB drive 200 may be implemented as part of USB drive as shown in FIG. 1. For purposes of illustration, certain references used here are maintained the same with respect to prior figures. Referring to FIG. 2, in one embodiment, pen-shape USB drive 200 includes a button 104 coupled to a first end of housing 103 and a front cap 201 coupled to a second end of housing 103. Housing 103 is used to enclose a USB plug connector having a flash device herein, such as, for example, a COB extended USB 203, a metal case 205, and a COB support 204 for supporting the COB 203. The COB 203 supported by the COB support 204 may then be inserted and enclosed by metal case 205 and therefore, forming a USB plug connector assembly (e.g., extended USB plug connector) which when pushed or deployed, extends from an opening or slot 106 of the front cap 201.

The pen-shape USB drive 200 further includes an end cap 207 having a cut out therein to hold the USB plug connector assembly. The USB drive 200 further includes a rotator 206, which when pushed by the button 104, pushes the end cap 207 which in turns pushes or deploys the USB plug connector out through the opening 106 of front cap 201. When the USB drive 200 is in a deployed mode, spring 202 disposed within a chamber of front cap and aligned by an alignment pin 209 of front cap 201 is compressed which generates a force that pushes the end cap 207 away from the front cap 201. When a user of the USB drive 200 presses the button again 104 again, the USB plug connector is retracted into housing 103 from the second end, in part pushed by the spring 202, and the button is pushed back and out from housing at the first end and stopped by an end stop ring 208 so that the button 104 is not completely pushed out and falls off from housing 103.

Figure 3B:
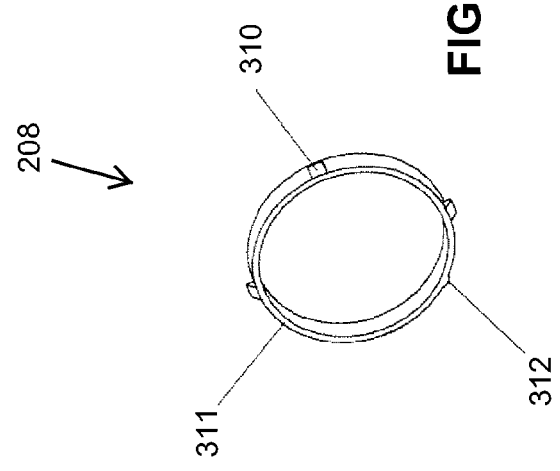
FIGS. 3A-3D are diagrams showing certain components of a USB drive pen device according to certain embodiments.
Figure 3D:
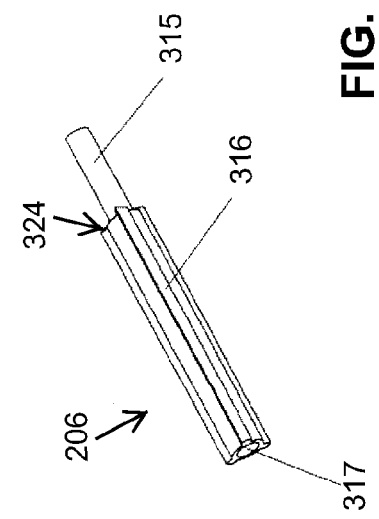
Figure 3A:
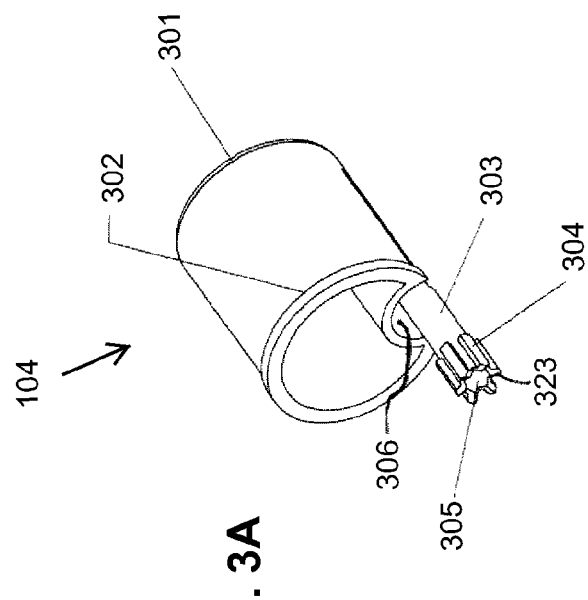
Figure 3C:
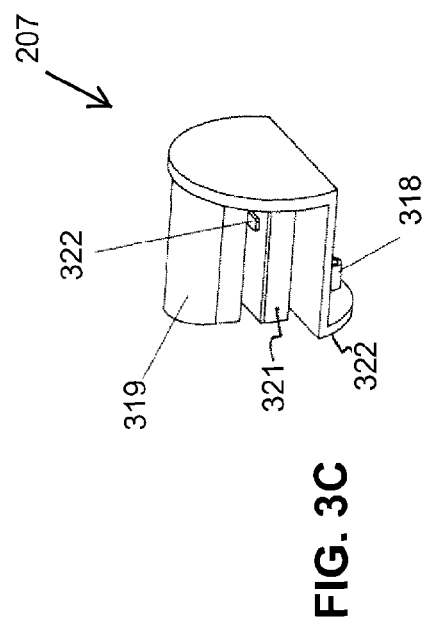
Figure 4:
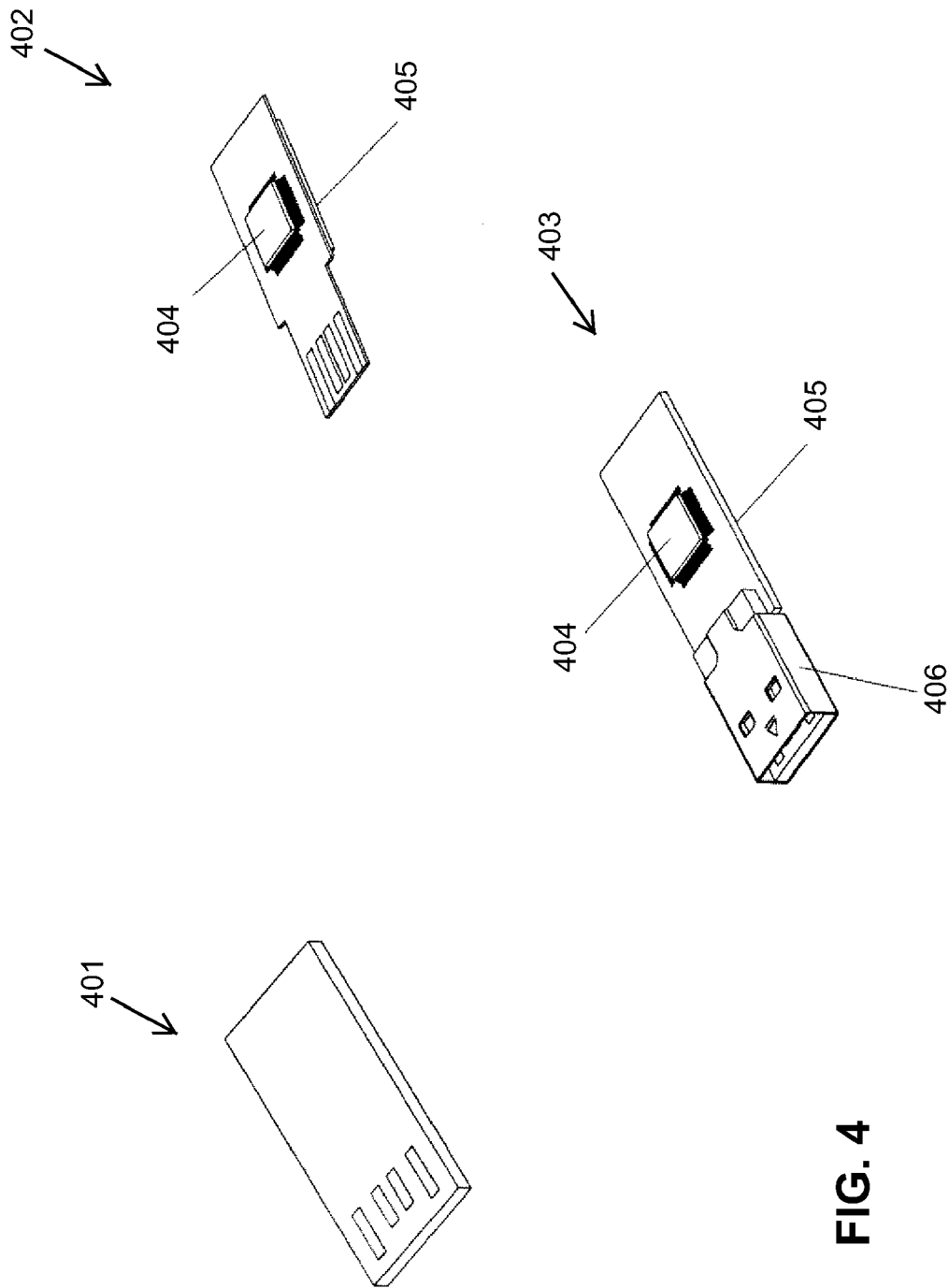
FIG. 4 is a diagram showing a USB plug assembly according to one embodiment.

FIGS. 3A-3D are diagram illustrating certain components of a pen-shape USB drive in perspective views according to one embodiment of the invention. Referring to FIGS. 3A-3D, button 104 includes a close end 301 and an open end having an end stop surface 302. A surface of button 104 is bended inwardly to form a channel or slot 306 in which a pusher rod 303 is disposed therein, where channel or slot 306 has a substantially half circle cross section. The pusher rod 303 includes multiple tabs 304 (in this example, six tabs) and an alignment hole 305 therethrough. The end stop surface 302 is used to stop button 104 to be completely popped out from housing 103 of FIG. 2. When a user presses close end 301 from a deployed mode, button 104 is pushed partly via spring 202 of FIG. 2 and stopped by end stop surface 311 of end stop ring 208 as shown in FIG. 3B. The end stop ring 208 includes one or more tabs 310 to lock the end stop ring at the end of housing 103 and alignment tab 312 to align the end stop ring 208 with respect to housing 103.

The tabs 304 of pusher rod 303, when pushed by close end 301 of button 104, engages with tabs 316 of rotator 206 via pointed ends 323-324, where the pusher rod 303 and rotator 206 are aligned by inserting an alignment pin 315 of rotator 206 into the alignment hole 305 of pusher rod 303. The rotator 206 further includes an alignment hole 317 at the other end opposite to the alignment pin 315 to align the rotator 206 with an alignment pin 318 of end cap 207. End cap 207 includes a top piece 319 forming a chamber or container for containing spring 202 and a bottom piece 322 with alignment pin 318 attached thereon. In addition, end cap 207 further includes a center piece 321 for holding the USB plug connector having COB 203, support 204 and metal case 205. The metal case 205 may slide through and enclose the center piece 321, and sandwiched by top piece 319 and bottom piece 322. When the metal case 205 slides onto the center piece 321, tabs 320 of the end cap 207 are interlocked with corresponding slots of the metal case 205 as shown in FIG. 7.

Figure 7:
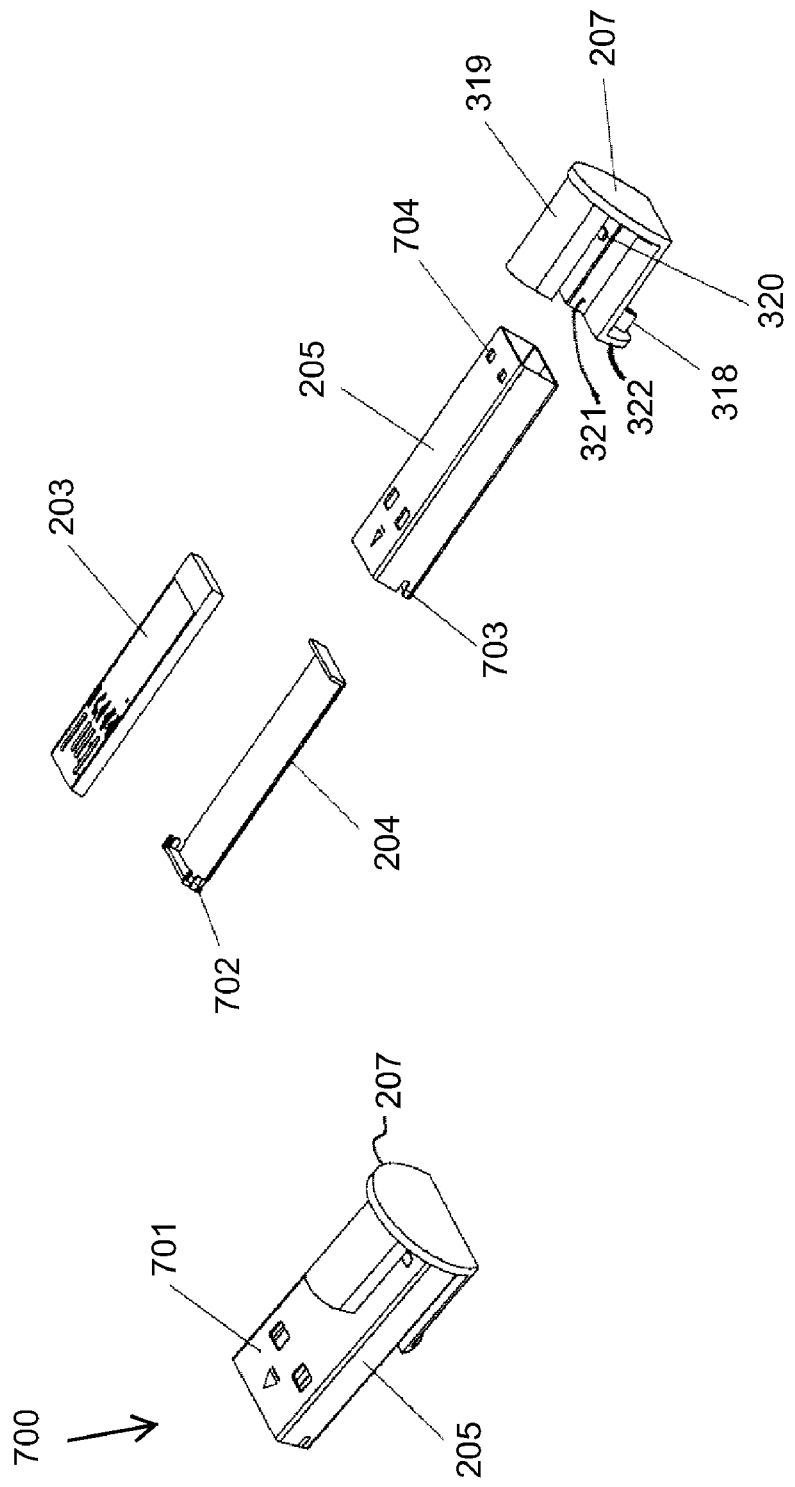
FIG. 7 shows an embodiment of USB assembly and an end cap.

Referring to FIG. 7, COB USB package 203 may be deposited into the support 204 having tabs 702. When the support 204 with the COB 203 slides within the metal case 205, tabs 702 of support 204 are engaged and interlocked with slots 703 of metal case 205, forming USB plug 701. USB plug 701 may then slide onto center piece 321 of end cap 207 and sandwiched by top piece 319 and bottom piece 322. Specifically, COB extended USB is dropped into COB support tray with metal contact fingers facing upward. COB support tray is inserted into the metal case until tabs of COB support snap into front slots of the metal case. The end cap is inserted into the metal case until tabs 320 of the end cap snap into back slots 704 of the metal case, forming the finished package 700 which may then be inserted into housing 103.

Note that the COB USB plug connector may be implemented in various configurations or form factors, such as, for example, COB package 401, standard PCBA package 402 having a flash controller 404 and flash memory chip 405, or a PCBA package with a USB connector 406. Detailed information regarding these USB plug connector can be found in a co-pending U.S. patent application Ser. No. 11/866,927, filed Oct. 3, 2007, entitled "Extended USB Plug, USB PCBA, and MLC USB Flash Drive with Dual-Personality", which is hereby incorporated by reference in its entirety.

Figure 5:
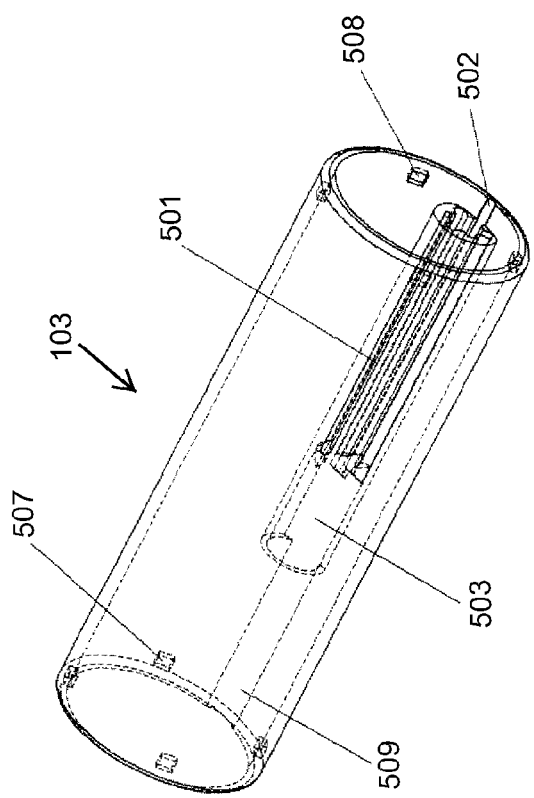
FIG. 5 is a diagram showing an embodiment of a housing.
Figure 5:
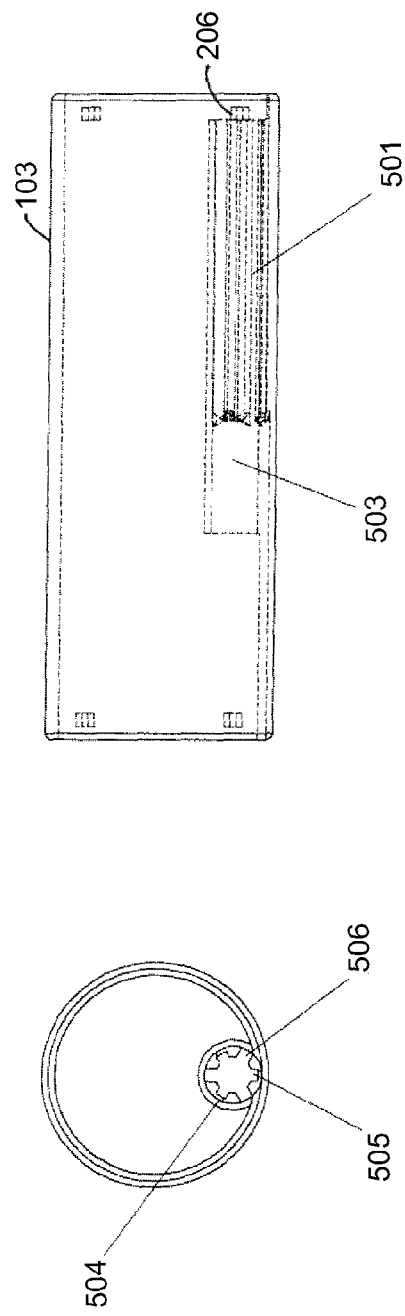
Figure 5:
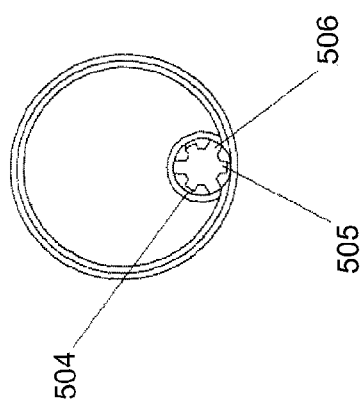

FIG. 5 is a diagram illustrating an example of housing of a pen-shape USB drive according to one embodiment of the invention. Referring to FIG. 5, housing 103 includes an inner tube 503 and tunnel 501 extended from each other. The inner tube 503 includes multiple deployed angled corners 504 disposed at the intersection of the inner tube 503 and tunnel 501. The tunnel 501 includes multiple shallow slots or grooves 505 and deep slots grooves 506. When button 104 is pressed and moving inside of housing 103, channel 306 of button 104 slides on the top of tunnel 501 of housing 103, while pusher rod 303 is traveling inside tunnel 501 of hosing 103. Particularly, tabs 304 of pusher rod 303 slide through shallow slots 505 and deep slots 506 of tunnel 501 of housing 103, pushing rotator 206 inside tunnel 501 and/or inner tube 503.

During a deployed position, the rotator 206 is pushed by the pusher rod 303 through tunnel 501 and past the intersection of inner tube 503 and tunnel 501. Thereafter, once the button 104 is released, spring 202 pushes rotator 206 backward upon which, the tips of tabs or wedges 316 of rotator 206 are stopped or locked in the deployed angled corners 504 of wedges or tabs of tunnel 501 to retain the deployed position. When the rotator 206 is pushed again, the deployed angled corners 504 cause the rotator 206 to rotate, where the tabs 316 of rotator 206 is positioned in the deep slots 506. The spring 202 pushes the rotator 206 back out to retract the end cap 207 having the USB plug therein from the opening 106 of front cap 201. Further detailed information regarding the operations of rotator 206 can be found in a co-pending U.S. patent application Ser. No. 11/682,261, filed Mar. 5, 2007, entitled "Universal Serial Bus Flash Drive with Deploying and Retracting Functionalities", which is incorporated by reference herein in its entirety.

Figure 6:
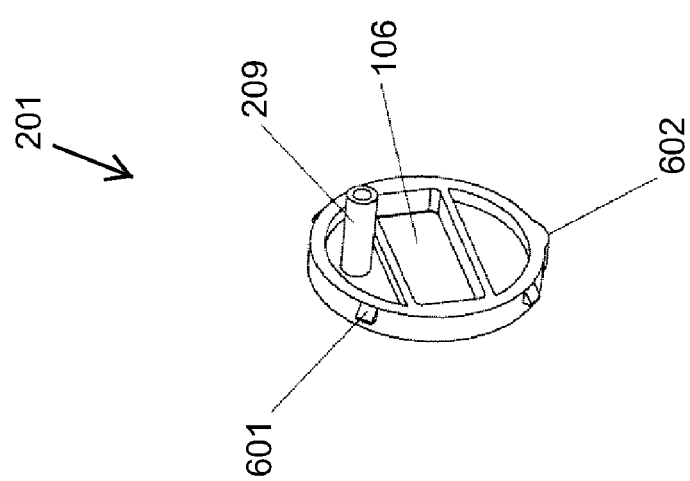
FIG. 6 shows an embodiment of a front cap.

Housing 103 further includes multiple front cap slots 507 to engage with tabs 601 of front cap 201 in order to interlock with the front cap 201. Similarly, housing 103 further includes several back slots 508 for interlock with tabs 310 of end ring 208. Housing 103 further includes an alignment slot 509 to align with an alignment tab 602 of front cap 201 as shown in FIG. 6.

Figure 8:
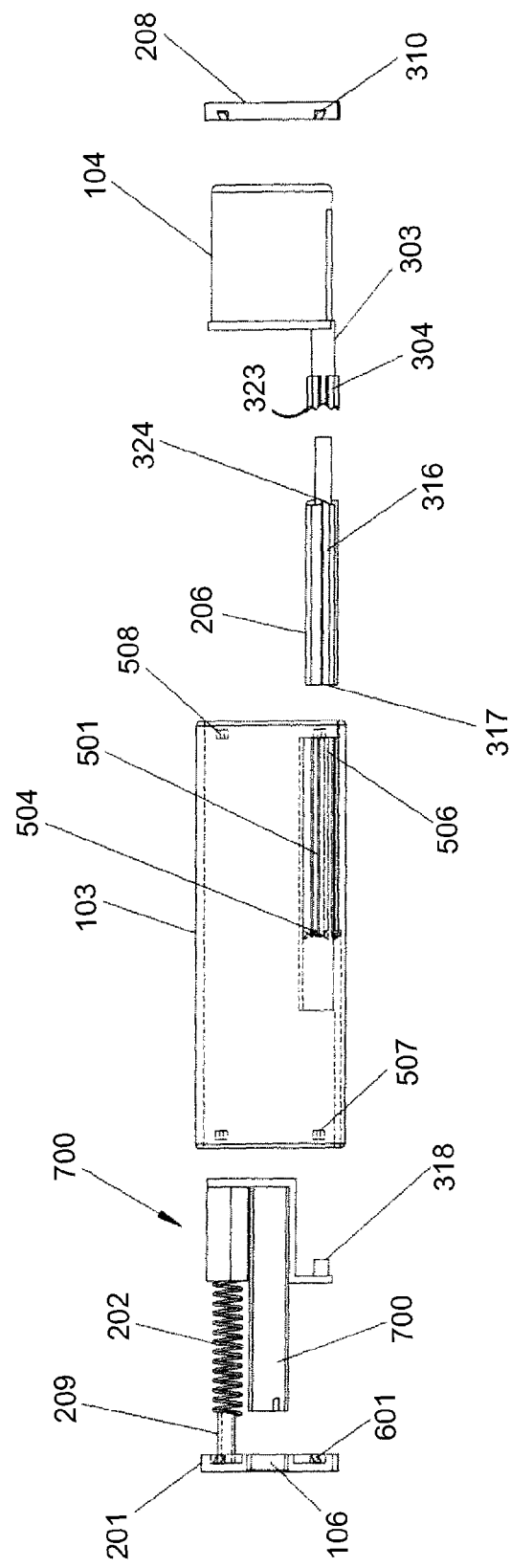
FIG. 8 shows a process to assemble a USB drive pen device according to one embodiment.

FIG. 8 is a diagram illustrating a complete view of assembling a pen-shape USB drive according to one embodiment. Referring to FIG. 8, spring 202 slides into spring container of the end cap of sub assembly 700 for temporary holding spring in place. Sub assembly 700 is inserted into housing 103 first; then front cap 201 is pressed into housing 103 aligning USB plug of sub assembly 700 into cut-out 106 of front cap 201 and spring's end into spring protrusion 209 of front cap 201 until tabs 601 of front cap 201 snap into front slots 507 of housing 103. Next rotator 206 is inserted into tunnel 501 of housing 103 with tabs 316 of the rotator 206 go into deep slots 506 of housing 103 until alignment pin 318 of sub assembly 700 goes into alignment hole 317 of rotator 206. Button 104 is then inserted into housing 103 with pusher's tabs 304 go into deep and shallow slots of housing 103. Finally, end stop ring 208 is pressed into housing 103.

Figure 9A:
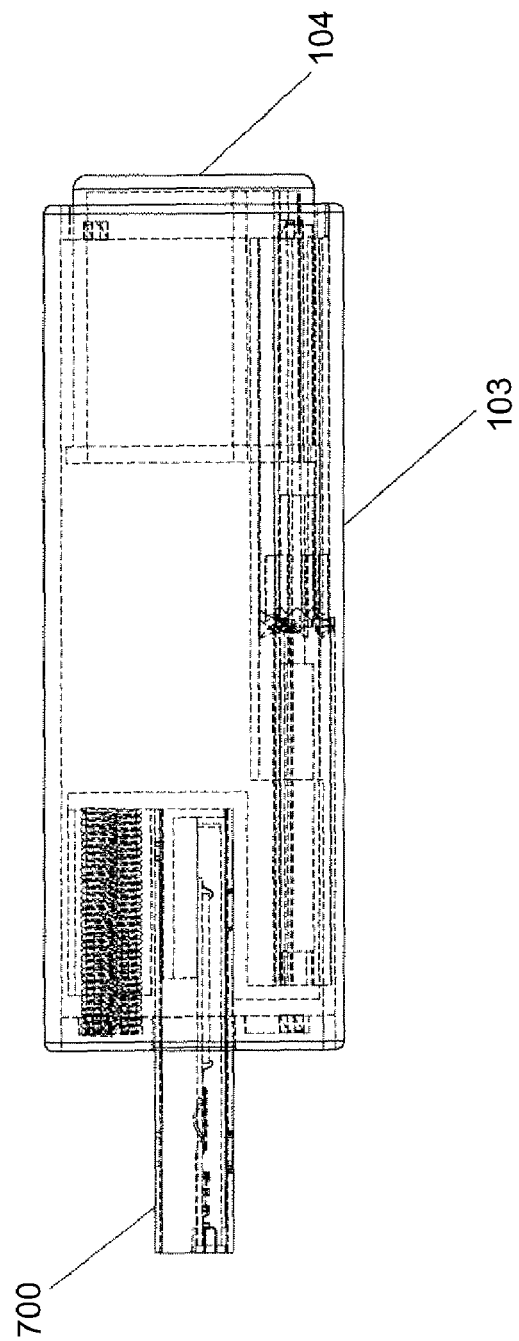
FIGS. 9A-9B show a USB drive pen device in a deployed and retracted modes.

When a user presses the button 104 to deploy the USB plug causing sub assembly 700 (COB USB flash drive) moving forward inside housing 103. The whole concept idea evolves around the motion of the pusher rod 303 (with button 104) and the rotator 206 inside the tunnel 501 of the housing 103. The rotator 206 is pushed by the pusher rod 303 of the button 104 and then the rotator 206 in turn pushes the sub assembly 700. While in motion, the sub assembly 700 can only move in straight line forward motion because the USB plug is trapped into the cut-out 106 of front cap 201. Spring 202 meanwhile is being compressed between container of the end cap and protrusion of the front cap during deploying motion of sub assembly 700. When the tabs of the rotator 206 click passes the tunnel 501 of housing 103, the user feels it and releases pressing the button 104 and spring 202 automatically enforces pressure to push backward the sub assemble 700 inside housing 103. The rotator 206 rotates (e.g., clockwise) to a deployed locked position as the pointed tabs of the rotator are locked in the deployed angled corners of housing 103, as shown in FIG. 9A.

Figure 9B:
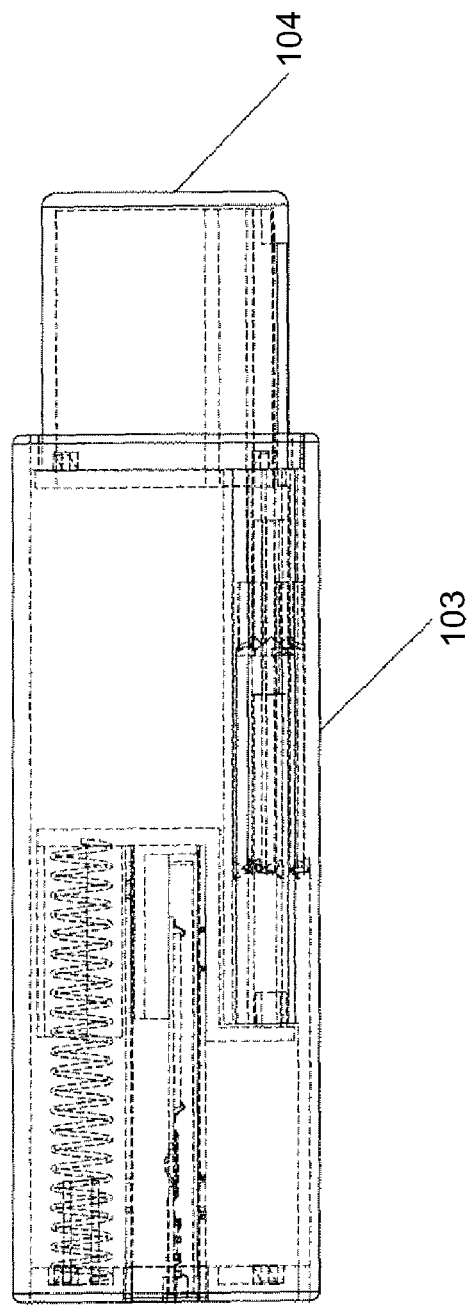

To release the deployed locked position, the user presses button 104 again, where the pointed ends of the rotator 206 are pushed away from the deployed angled corners. The user then quickly releases pressing the button 104 and spring 202 automatically enforces pressure to push backward sub assembly 700 all the way back inside housing 103. The rotator 206 is now pushed by the sub assembly 700 and rotates until its tabs slide into deep slots of housing 103 and then the rotator 206 in turn pushes the pusher rod 303 of the button 104 back to the original position. Note that when tabs of rotator are in deep slots of housing, the rotator can only move straight line. At retracted lock position, the end stop surface of the button is pressed against the end stop surface of the end stop ring, as shown in FIG. 9B.

Alternative Embodiment of Pen-Shape USB Drive

Figure 10:
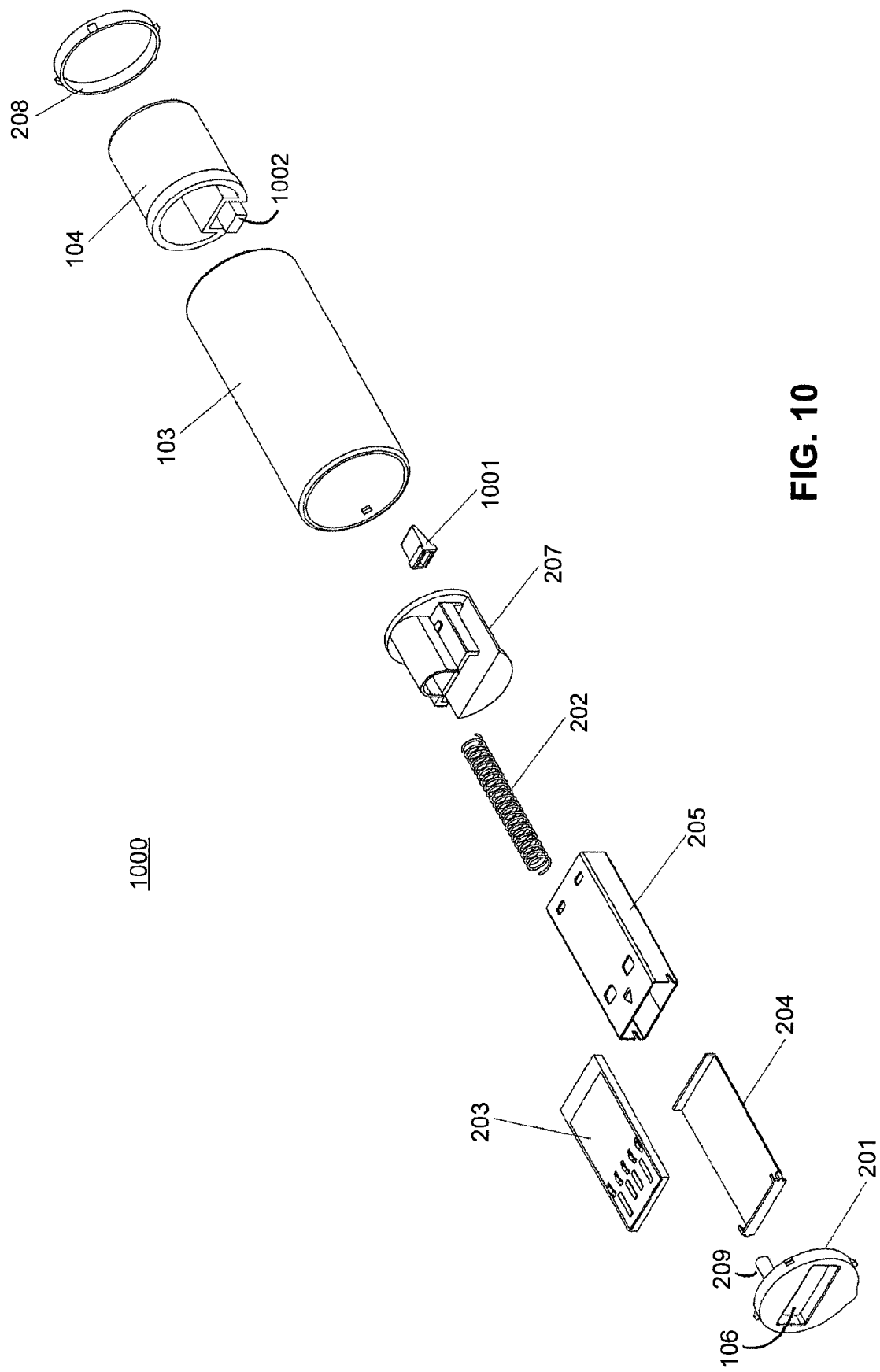
FIG. 10 shows another embodiment of a USB drive pen device in an exploded view.

FIG. 10 is a diagram illustrating a pen-shape USB drive according to another embodiment of the invention. For example, pen-shape USB drive device 1000 may be implemented as part of those shown in FIG. 1. For purposes of illustration, certain references used here are maintained the same with respect to prior figures. Referring to FIG. 10, similar to the one shown in FIG. 2, in one embodiment, pen-shape USB drive 1000 includes a button 104 coupled to a first end of housing 103 and a front cap 201 coupled to a second end of housing 103. Housing 103 is used to enclose a USB plug connector having a flash device herein, such as, for example, a COB extended USB 203, a metal case 205, and a COB support 204 for supporting the COB 203. The COB 203 supported by the COB support 204 may then be inserted and enclosed by metal case 205 and therefore, forming a USB plug connector assembly (e.g., extended USB plug connector) which when pushed or deployed, extends from an opening or slot 106 of the front cap 201.

The pen-shape USB drive 1000 further includes an end cap 207 having a cut out therein to hold the USB plug connector assembly. When the USB drive is in a deployed mode, spring 202 disposed within a chamber of end cap and aligned by an alignment pin 209 of front cap 201 is compressed which generates a force that pushes the end cap 207 away from the front cap 201. When a user of the USB drive presses the button again 104 again, the USB plug connector is retracted into housing 103 from the second end, in part pushed by the spring 202, and the button is pushed back and out from housing at the first end and stopped by an end end stop ring 208 so that the button 104 is not completely pushed out and falls off from housing 103.

In addition, USB drive 1000 includes a block 1001 and a pusher rod 1002 extended from a slot or channel of button 104. When USB drive 1000 is in a deployed position, pusher rod 1002 pushes block 1001 which in turn pushes end cap 207 to deploy the USB plug through opening 106 of front cap 201. When button 104 is pushed again, the USB plug is retracted into the housing 103. Block 1001 is used to lock the USB plug in either a deployed position or a retracted position.

Figure 11D:
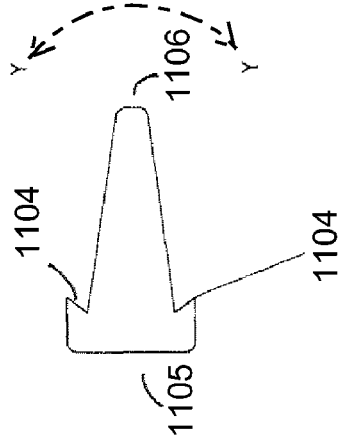
Figure 11E:
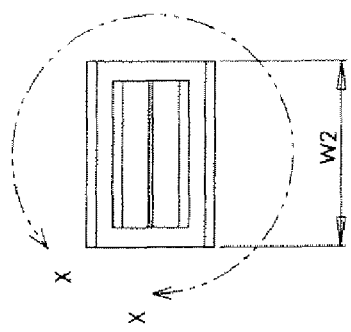
Figure 11F:
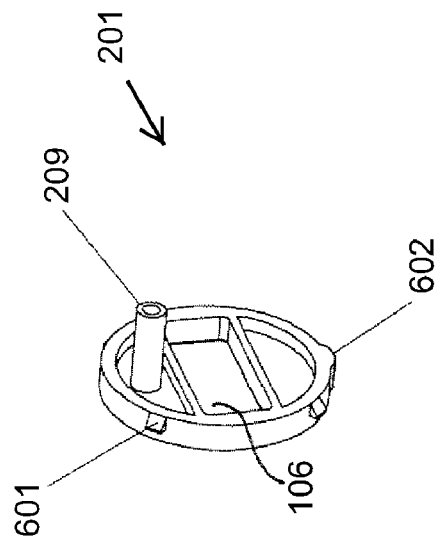
Figure 11F:
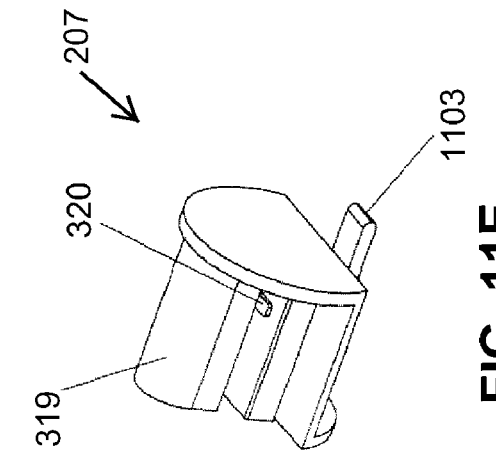

FIGS. 11A-11F are diagrams illustrating various components of a pen-shape USB drive according to one embodiment of the invention. Referring to FIGS. 11A-11F, button 104 includes a close end 301 and an open end having an end stop surface 302. A surface of button 104 is bended inwardly to form a channel or slot 306 in which a pusher rod 303 is disposed therein. In this example, pusher rod 303 is in a longitudinal rectangular shape. The end stop surface 302 is used to stop button 104 to be completely popped out from housing 103. When a user presses close end 301 from a deployed mode, button 104 is pushed partly via spring 202 of FIG. 10 and stopped by end stop surface 311 of end stop ring 208 as shown in FIG. 11B. The end stop ring 208 includes one or more tabs 310 to lock the end stop ring at the end of housing 103 and alignment tab 312 to align the end stop ring 208 with respect to housing 103.

Figure 12:
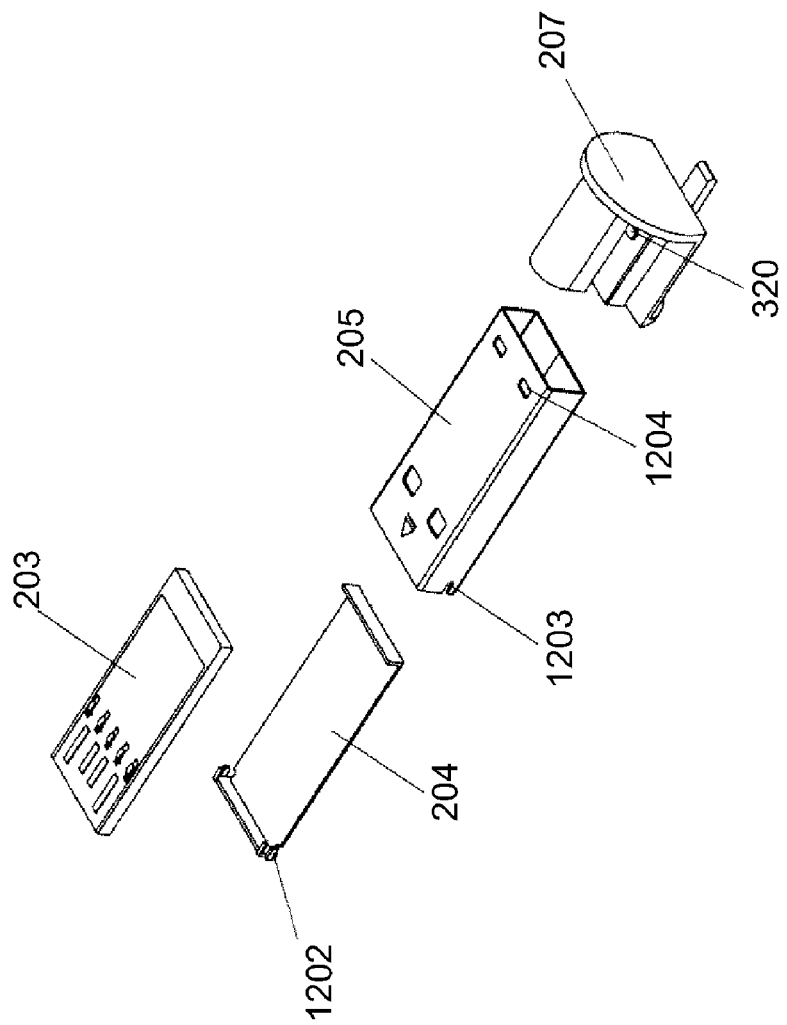
FIG. 12 shows another embodiment of USB assembly and an end cap.
Figure 12:
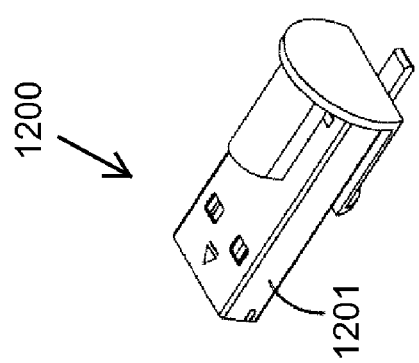

Housing 103 is in a cylindrical or round tube shape having a chamber 1106 therein, where chamber 1106 has a rectangular cross section, such that block 1001 can only travel in a straight forward direction without rotating or twisting. The chamber 1006 has a deployed lock corner 1102 and a retracted lock corner 1101 so that the tabs 1104 of block 1001 could be locked in according locations. Housing 103 further includes one or more front slots 1107 to snap with the corresponding tabs of front cap 201 and one or more back slots 1108 to snap with the corresponding tabs of end stop ring 208. Front end cap 201 may be implemented similar to the one shown in FIG. 6 and end cap 207 may be implemented similar to the one shown in FIG. 3C. However, instead of having an alignment pin 318, end cap 207 of FIG. 11E further includes a pusher rod or tongue 1103. When a user presses button 104, button 104 pushes pusher rod 1002 which in turn pushes a first end 1106 of block 1001 and a second end 1105 of block 1001 having a recess in turn pushes pusher rod 1103 of end cap 207 to deploy or retract the USB plug 1200 as shown in FIG. 12, which may be assembled in a manner similar to a way assembling the USB plug 700 of FIG. 7.

Figure 13:
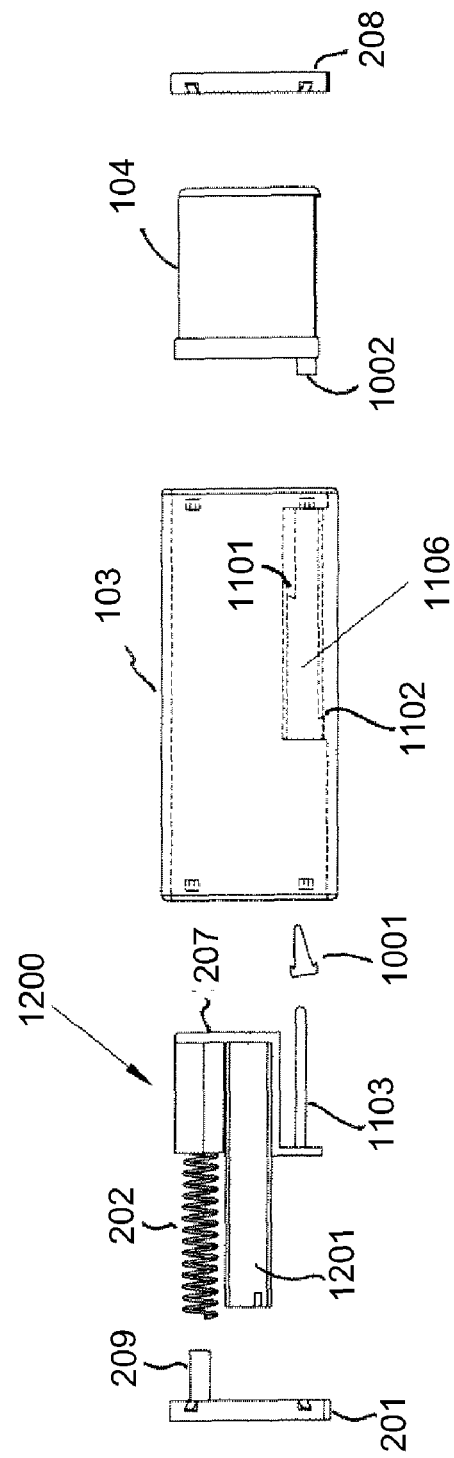
FIG. 13 shows a process to assemble a USB drive pen device according to another embodiment.

FIG. 13 is a diagram illustrating a process of assembling a pen-shape USB drive device according to one embodiment of the invention. Referring to FIG. 13, when a user presses button 104 to deploy the USB plug 1201, the button 104 pushes pusher rod 1002 which in turn pushes block 1001. Block 1001 in turns pushes pusher rod or tongue 1103 of end cap 207 which in turn pushes sub assembly 1200 having COB USB flash drive 1201 moving forward inside housing 103 and extending through an opening 106 of front cap 201. The whole concept idea evolves around the motion of the block 1001 inside the housing 103, where block 1001 is pushed by the pusher rod 1002 of the button 104, and then the block 1001 in turn pushes the sub assembly 1200. While in motion, the sub assembly 1200 can only move in straight line forward motion and block 1001 could rotate in Y-Y direction as shown in FIG. 11D. Spring 202 meanwhile is being compressed between container 319 of end cap 207 and protrusion 209 of front cap 201 during deploying motion of sub assembly 1200. When the lock tab 1104 of block 1001 clicks pass the deployed angled corner 1102 of housing 103, the user feels it and releases pressing the button 104 and spring 202 automatically enforces pressure to push backward sub assemble 1200 inside housing 103. In result, block 1001 travels backward a very short distance and stops at deployed locked position as the lock tab 1104 of the block 1001 is tilted downwardly and locked in the deployed angled corner 1102 of chamber 1106 of housing 103 as shown in FIG. 14A.

Figure 14B:
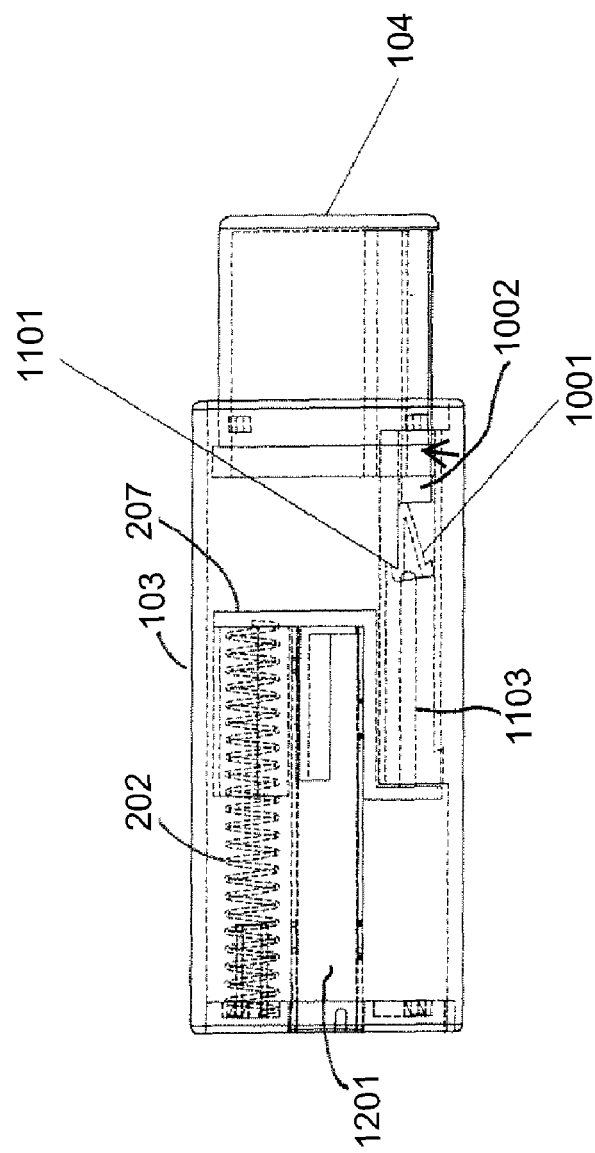

To release from the deployed locked position, the user may press button 104 again, the lock tab 1104 of block 1001 is released from the deployed angled corner 1102. The user then quickly releases pressing the button 104 and spring 202 automatically enforces pressure to push backward sub assembly 1200 all the way back inside chamber 1106 of housing 103. The block 1001 is now pushed by the sub assembly 1200. Block 1001 then in turn pushes the pusher rod 1002 of button 104 back to the original position. Again while in motion, by special design the block 1001 could rotate in Y-Y direction as shown in FIG. 11D. At the retracted lock position as shown in FIG. 14B, the lock tab 1104 of the block 1001 is tilted upwardly and locked in the retracted angled corner 1101 within chamber 1106 of housing 103. Other configurations may exist.

Alternative Embodiment of Pen-Shape USB Drive

Figure 15:
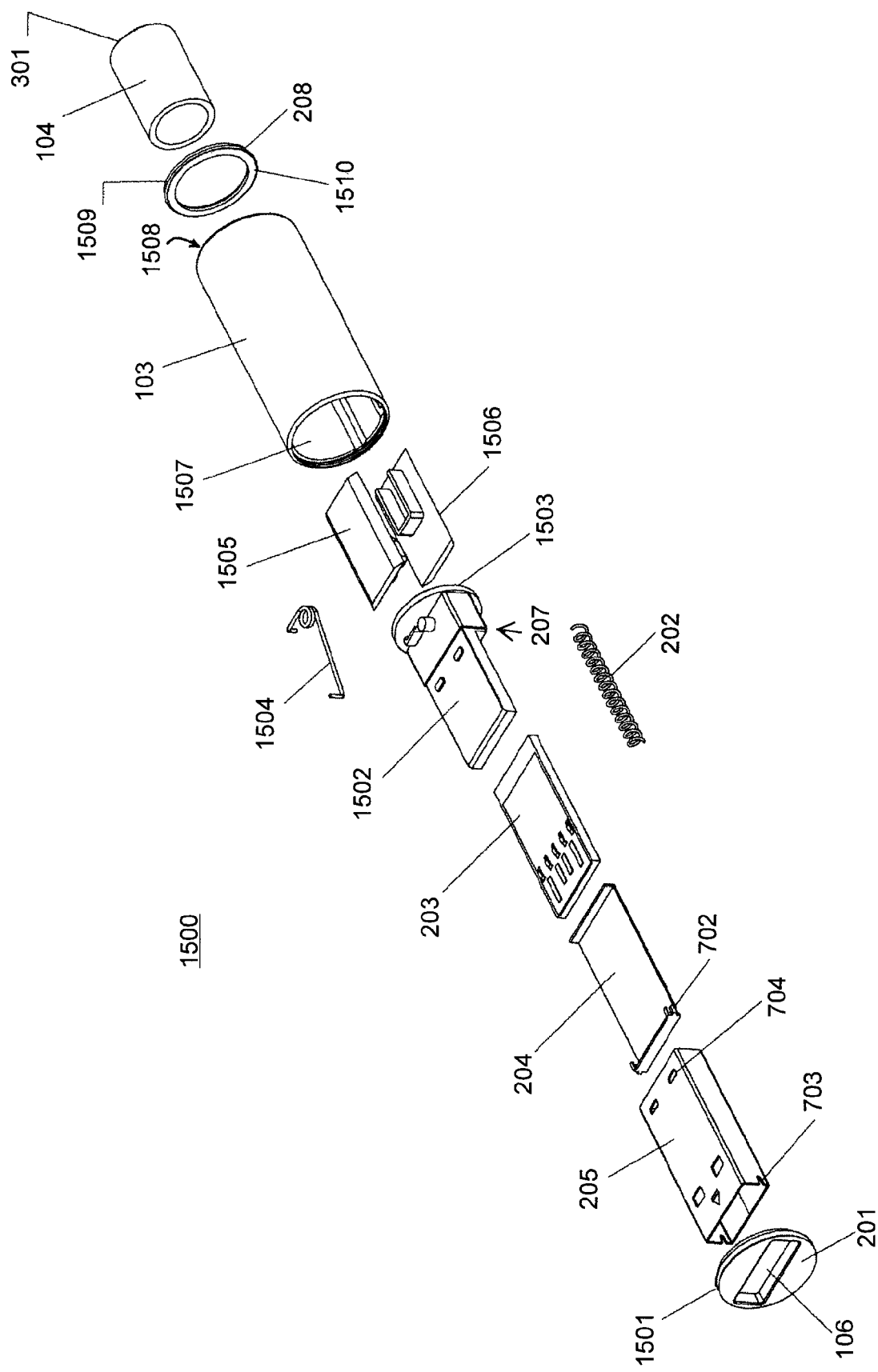
FIG. 15 shows another embodiment of a USB drive pen device in an exploded view.

FIG. 15 is a diagram illustrating a pen-shape USB drive according to another embodiment of the invention. For example, pen-shape USB drive device 1500 may be implemented as part of those shown in FIG. 1. For purposes of illustration, certain references used here are maintained the same with respect to prior figures. Referring to FIG. 15, similar to the one shown in FIG. 2, in one embodiment, pen-shape USB drive 1500 includes a button 104 coupled to a back end 1508 of housing 103 and a front cap 201 coupled to a front end 1507 of housing 103. Housing 103 is used to enclose a USB plug connector having a flash device herein, such as, for example, a COB extended USB 203, a metal case 205, and a COB support 204 for supporting the COB 203. The COB 203 supported by the COB support 204 may then be inserted and enclosed by metal case 205 and therefore, forming a USB plug connector assembly (e.g., extended USB plug connector) which when pushed or deployed, extends from an opening or slot 106 of the front cap 201.

The pen-shape USB drive 1500 further includes an end cap 207 having a USB plug support 1502 and a cut out to hold the USB plug connector assembly. USB drive 1500 further includes a spring clip 1504 disposed on end cap 207. USB drive 1500 further includes an upper tray 1505 and a lower tray 1506 which can slide into upper slots and lower slots of housing 103 respectively. Front cap 201 includes certain external threads to allow front cap 201 to be screwed onto internal threads of front end 1507 of housing 103. End stop ring 208 includes certain external threads 1509 to allow end stop ring to be screwed onto internal threads of back end 1508 of housing 103. End stop ring 208 further includes end stop surface 1510 to stop button 104 to fall off housing 103 when being retracted from a deployed position.

Figure 16A:
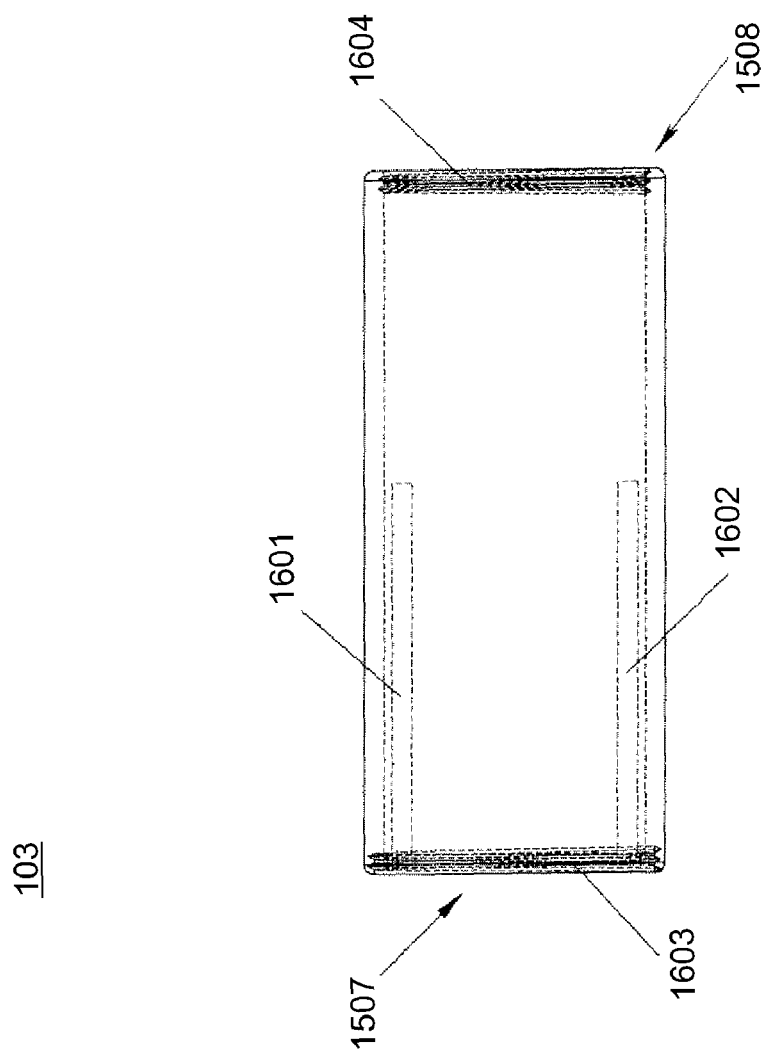
FIGS. 16A-16E are diagrams showing certain components of a USB drive pen device according to certain embodiments.
Figure 16A:
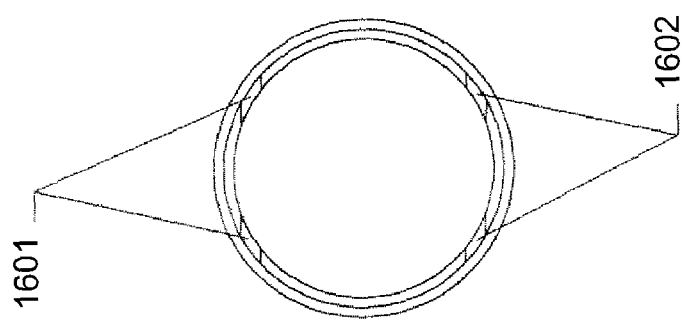

FIGS. 16A-16E are diagrams illustrating certain components of pen-shape USB drive 1500 of FIG. 15 according to certain embodiments of the invention. FIG. 16A shows an enlarged view of housing 103, which in this example, is in a longitudinal tube shape. Referring to FIG. 16A, front end 1507 of housing 103 includes upper slots 1601 to allow upper tray 1505 to slide therein and lower slots 1602 to allow lower tray 1506 to slide therein. Front end 1507 of housing 103 further includes several internal threads 1603 to engage with external threads 1501 of front cap 201 to allow front cap to be screwed onto front end 1507 of housing 103. Similarly, back end 1508 of housing 103 includes several internal threads 1604 to engage with external threads 1509 of end stop ring 208 to allow the end stop ring 208 to be screwed onto back end 1508 of housing 103.

Figure 16B:
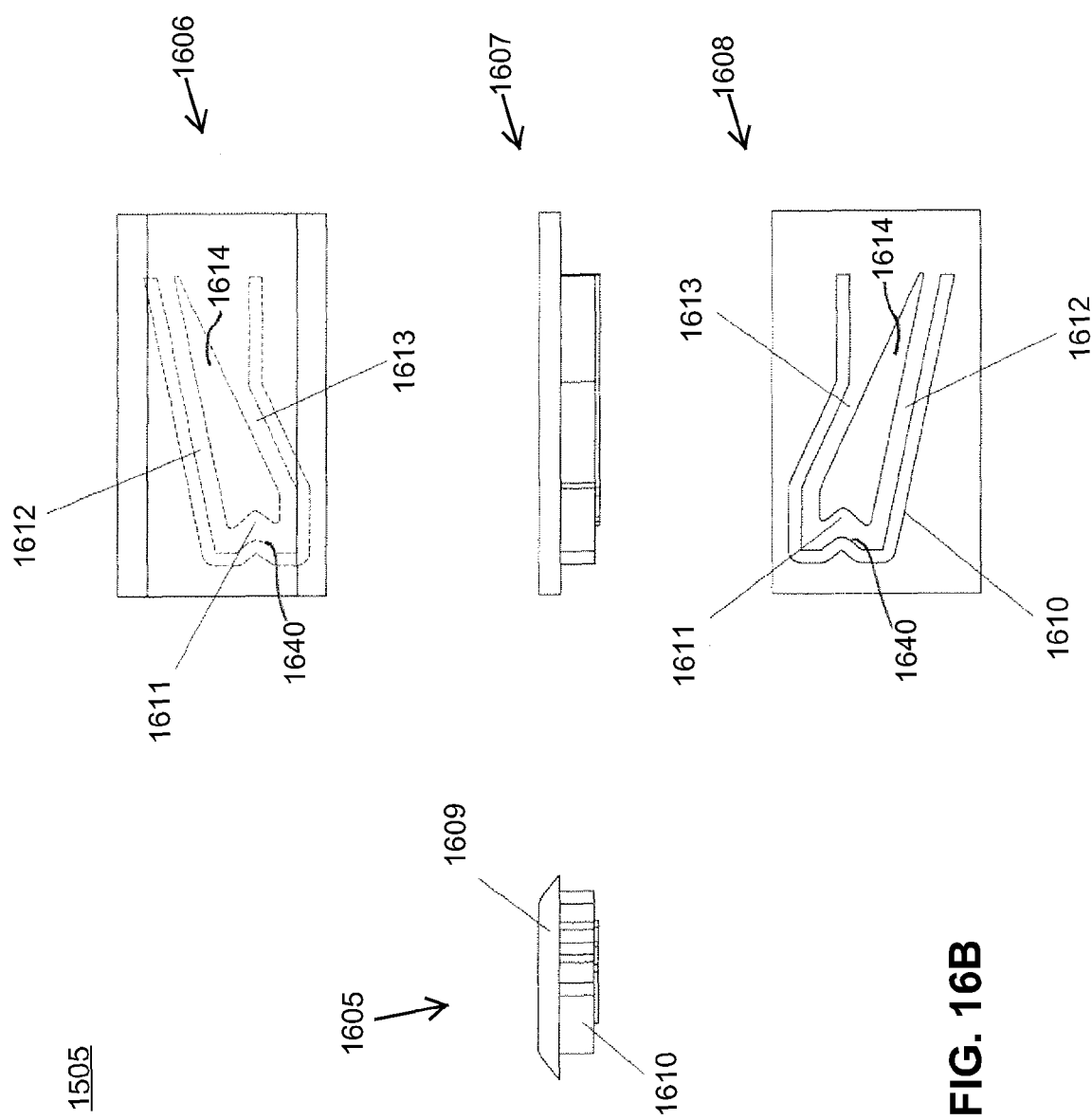

FIG. 16B shows an enlarged version of upper tray 1505, where upper tray 1505 is shown in a front view 1605, top view 1606, a side view 1607, and a bottom view 1608. Referring to FIG. 16B, upper tray 1505 includes an upper wall 1609 to allow upper tray 1505 to slide into upper slots 1601 of housing 103. Upper tray 1505 further includes a protrusion track 1610 encircling an island 1614 to form a retraction path 1612 and a deployment path 1613 in which a front tip of spring clip 1504 can travel during a retraction and deployment respectively. Track 1610 and island 1614 further form a lock groove 1611 to lock a tip of spring clip 1504 into one of retraction and deployed positions.

Figure 16C:
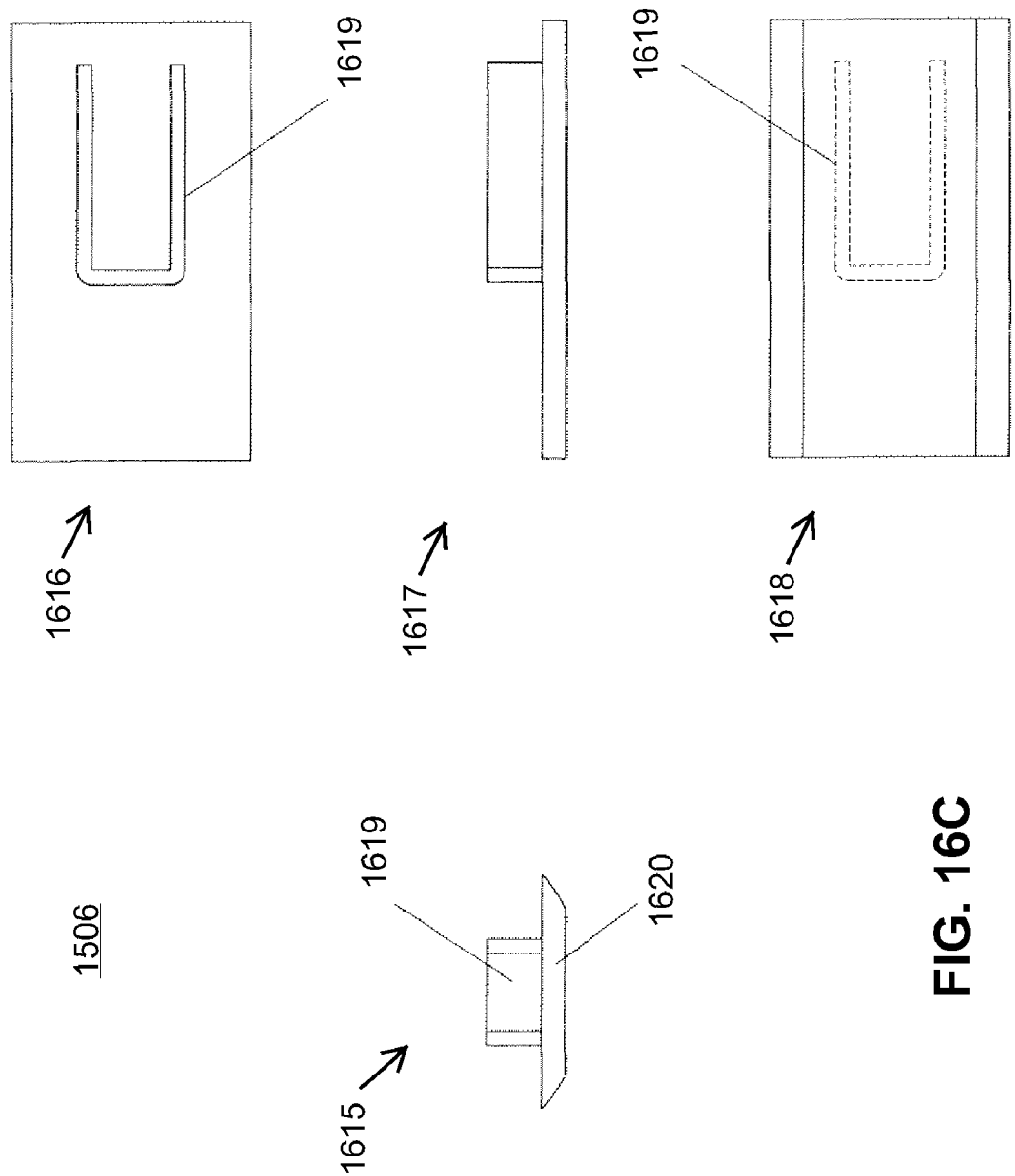

FIG. 16C shows an example of lower tray 1506 according to one embodiment of the invention. Referring to FIG. 16C, lower tray 1506 includes a lower wall 1620 to allow lower tray 1506 to slide into lower slots 1602 of housing 103. Lower tray 1506 further includes a protrusion container 1619 to hold spring 202 in place when end cap 207 as well as USB plug assembly are covered (e.g., sandwiched) by the upper tray 1505 and lower tray 1506.

Figure 16D:
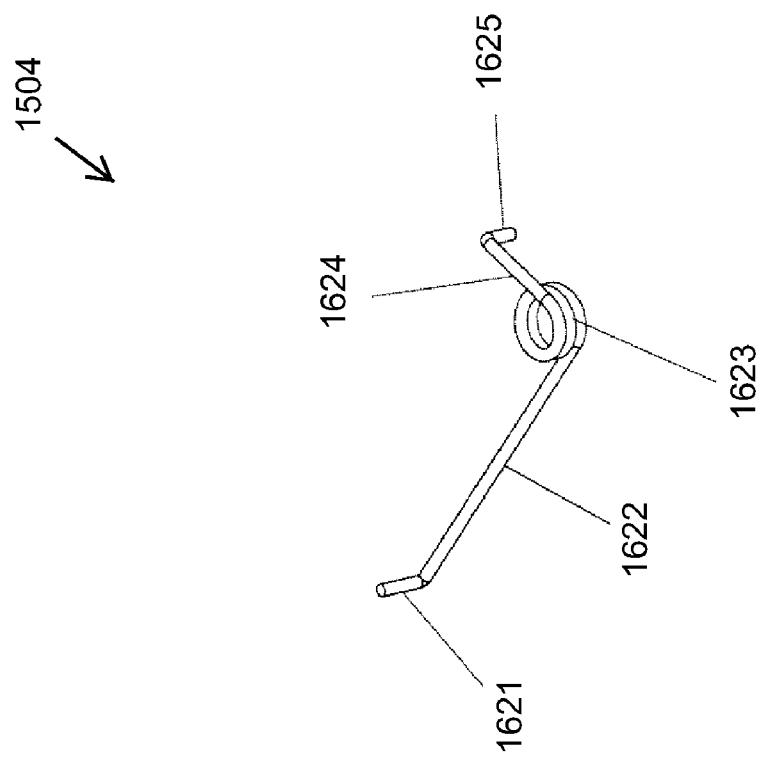

FIG. 16D shows an example of spring clip 1504 according to one embodiment. Referring to FIG. 16D, spring clip 1504 includes a front tip 1621 pointing upwardly, an angled arm 1622, a center ring 1623, a straight arm 1624, and an end tip 1625 pointing downwardly. End tip 1625 may be inserted into a hole of end cap 207 while front tip 1621 travels around the retraction path 1612 and deployment path 1613 of upper tray 1505.

Figure 16E:
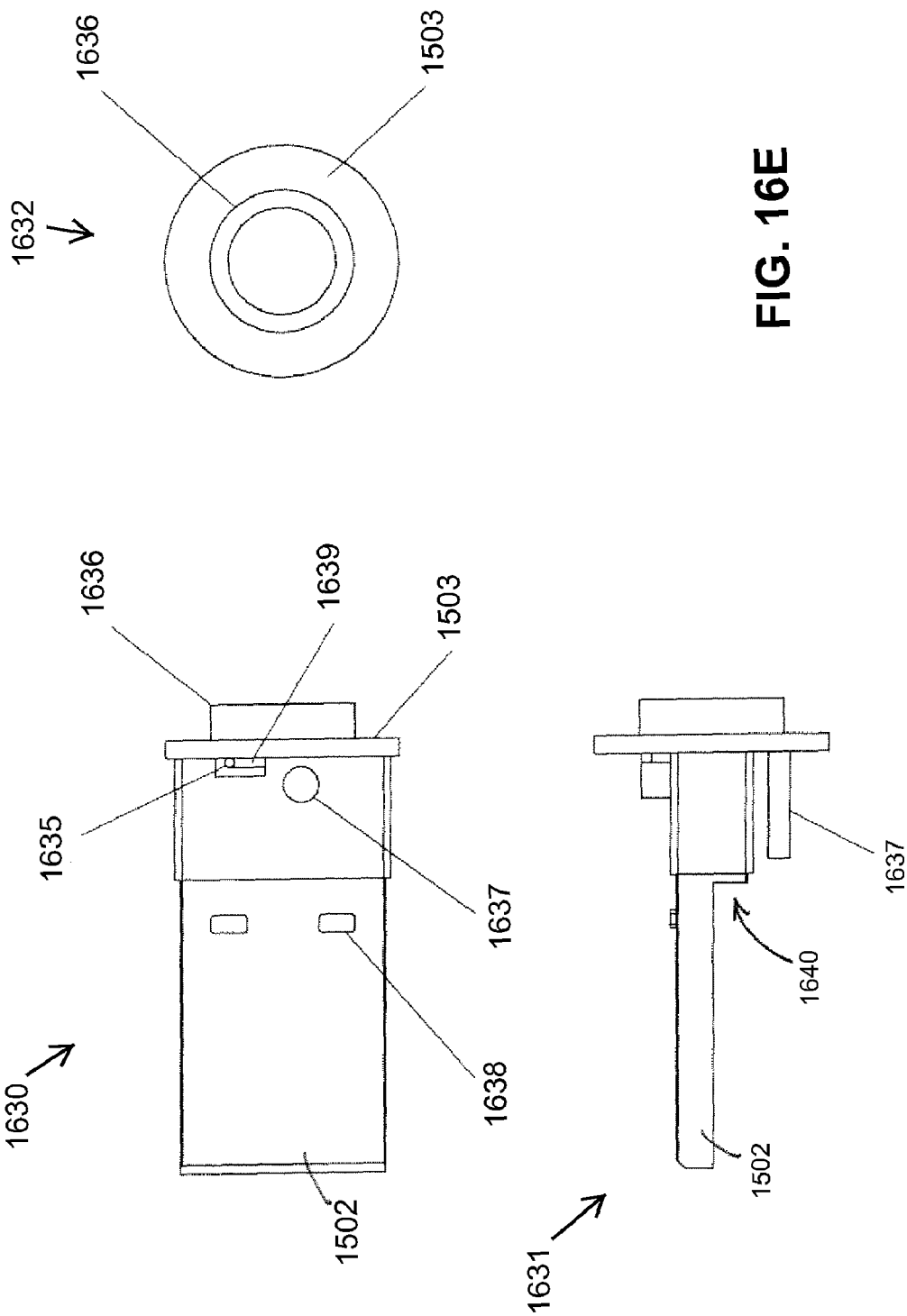

FIG. 16E shows an example of end cap 207 according to one embodiment. Referring to FIG. 16E, end cap 207 is shown in a top view 1630, a side view 1631, and a cross view 1632. End cap 207 includes a USB plug support 1502 which may slide into a metal case of the USB plug assembly when the USB plug assembly slides into a cut out 1640 of end cap 207, where tabs 1638 are snapped into slots of the metal case of USB plug assembly. End cap 207 further includes an end stop surface 1503 and a button protrusion 1636 to hold button 104 and to allow button 104 push the end stop surface 1503 which in turn pushes the USB plug assembly extended out through opening 106 of front cap 201 to be deployed. Similarly, during a retraction mode, the end stop surface 1503 pushes button 104 backwardly through the back end 1508 of housing 103. On the top surface of end cap 207, there is a post 1637, a slot 1639, and an end tip hole 1635. Post 1637 is used to hold spring clip 1504 in place by dropping center ring 1623 of spring clip 1504 onto and encircling post 1637, while end tip 1625 is inserted into end tip hole 1635 and straight arm 1624 is position along slot 1639. As a result, when front tip 1621 is traveling around the deployment path 1613, the end tip 1625 and center ring in a fixed position, provide resistant forces to force front tip 1621 towards the retraction path 1612 or vice versa.

Figure 17A:
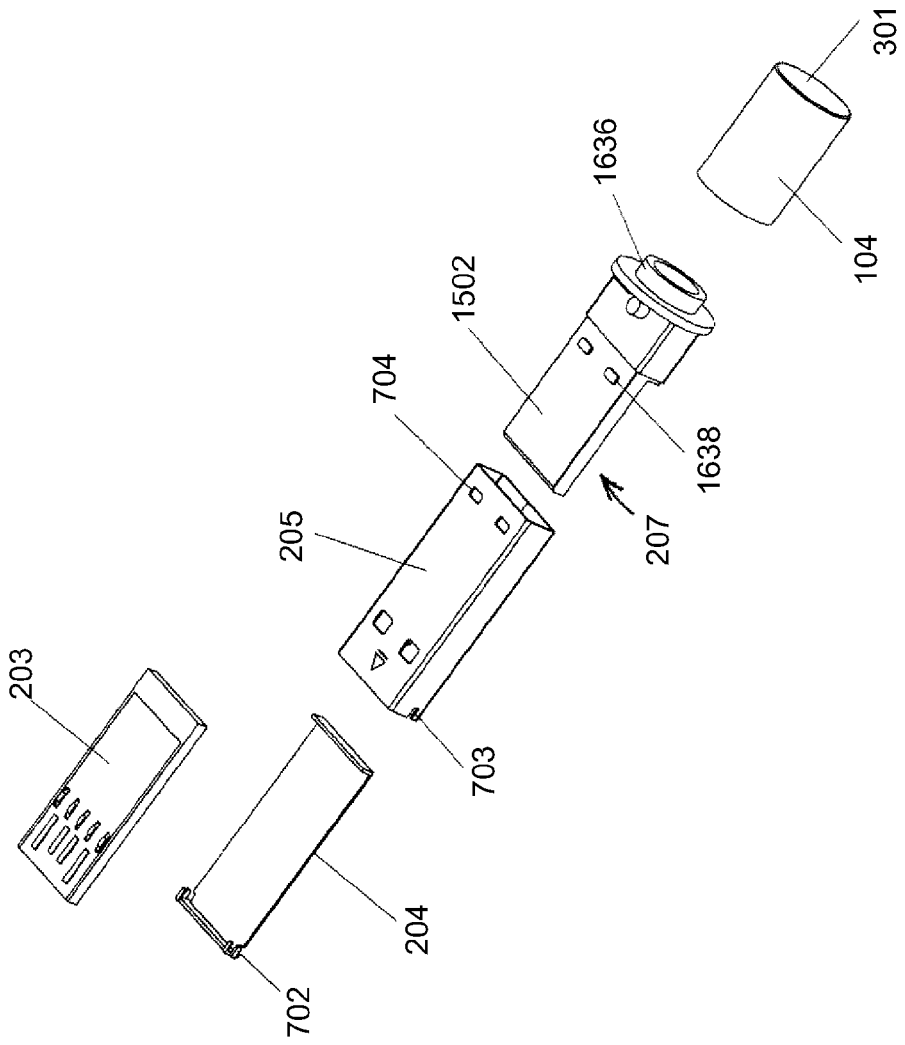
FIGS. 17A-17D are diagrams showing certain embodiments of a USB plug assembly.
Figure 17B:
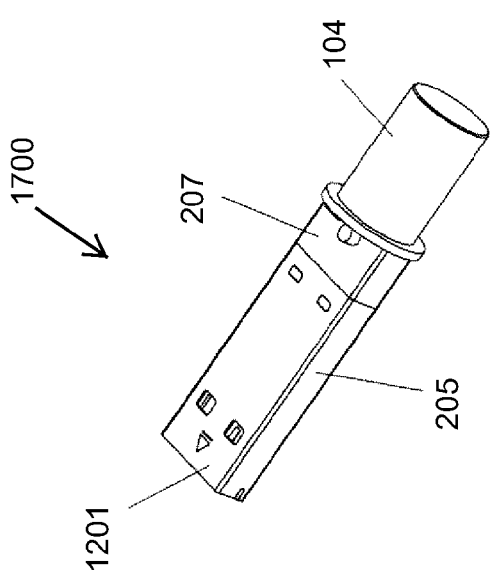
Figure 17D:
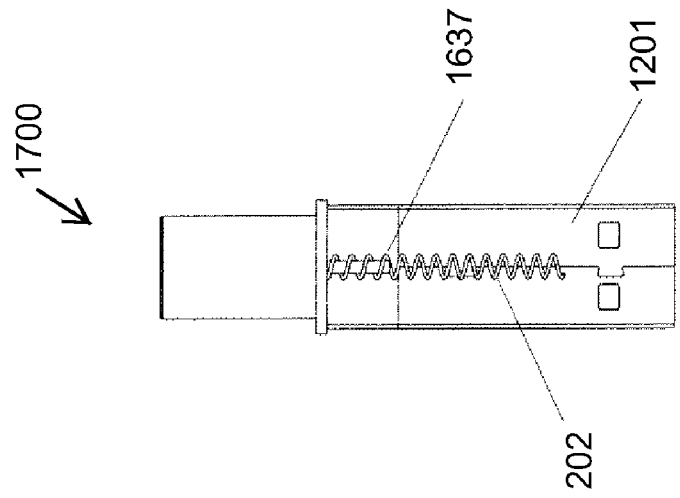
Figure 17C:
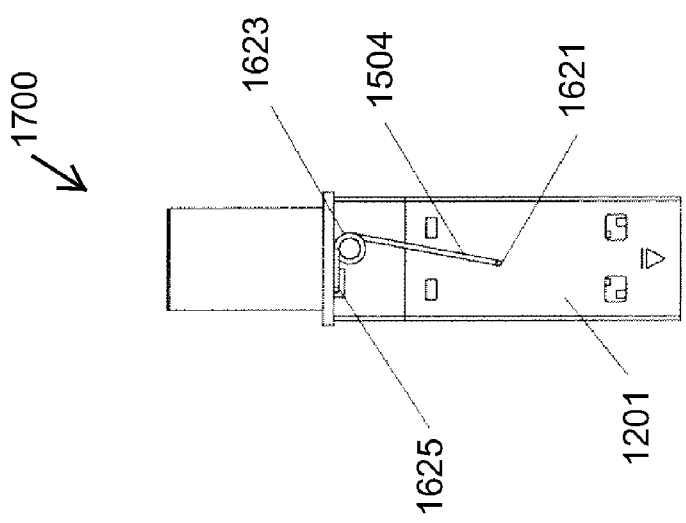

FIGS. 17A-17D show an example of USB plug assembly according to one embodiment. Referring to FIGS. 17A-17D, USB COB 203 is deposited into support tray 204 and inserted into metal case 205 in which tabs 702 of support tray are snapped into slots 703 of metal case 205, forming a USB plug connector 1201. USB plug connector 1201 may then slide over the USB plug support piece 1502 until tabs 1638 of support piece 1502 are snapped into slots 704 of metal case 205. As a result, inside of the metal case 205, USB COB 203 is sandwiched by support tray 204 and support piece 1502 as a cover, forming a USB plug assembly 1700. Button 104 is then pressed onto button intrusion 1636 against the end stop surface 1503. Thereafter, spring clip 1504 can be disposed on the top of USB plug assembly 1700 as shown in FIG. 17C using techniques described above. In addition, spring 202 can be positioned over spring protrusion 1637 at the bottom of end cap 207 as shown in FIG. 17D.

Figure 18:
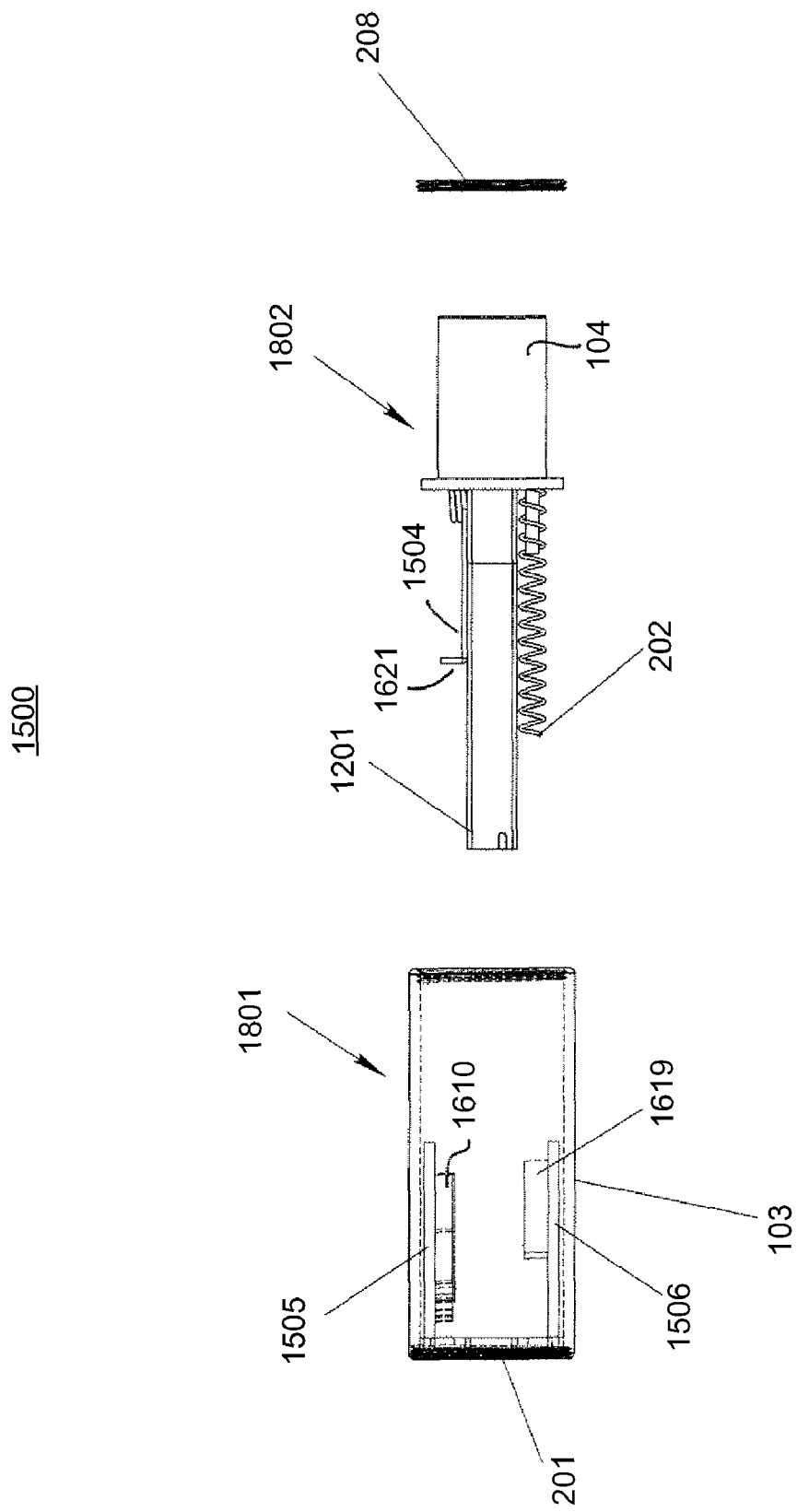
FIG. 18 shows a process to assemble a USB drive pen device according to another embodiment.

FIG. 18 is a diagram illustrating a process for assembling a pen-shape USB drive according to one embodiment of the invention. Referring to FIG. 18, COB extended USB is dropped onto COB support tray with metal contact fingers facing upward. COB support tray is inserted into the metal case until tabs of COB support snap into front slots of the metal case, forming a USB plug connector 1201. End cap 207 is then inserted into the metal case 205 of the USB plug connector 1201 until tabs of end cap snap into back slots of the metal case, forming sub assembly 1802. Thereafter, spring clip 1504 and spring 202 are attached to sub assembly 1802 as described above.

Further, upper tray 1505 slides into upper slots of housing 103 and lower tray 1506 slide into lower slots of housing 103. Front cap 201 is then screwed into the front end of housing 103 via the external and internal threads as described above. Sub assembly 1802 with spring clip and spring is inserted into sub assembly 1801 aligning USB plug of the metal case into cut-out of front cap 201 and an end of spring 202 is inserted into protrusion container 1619 of lower tray 1506. End stop ring 208 is then screwed into the back end of housing 103.

Figure 19A:
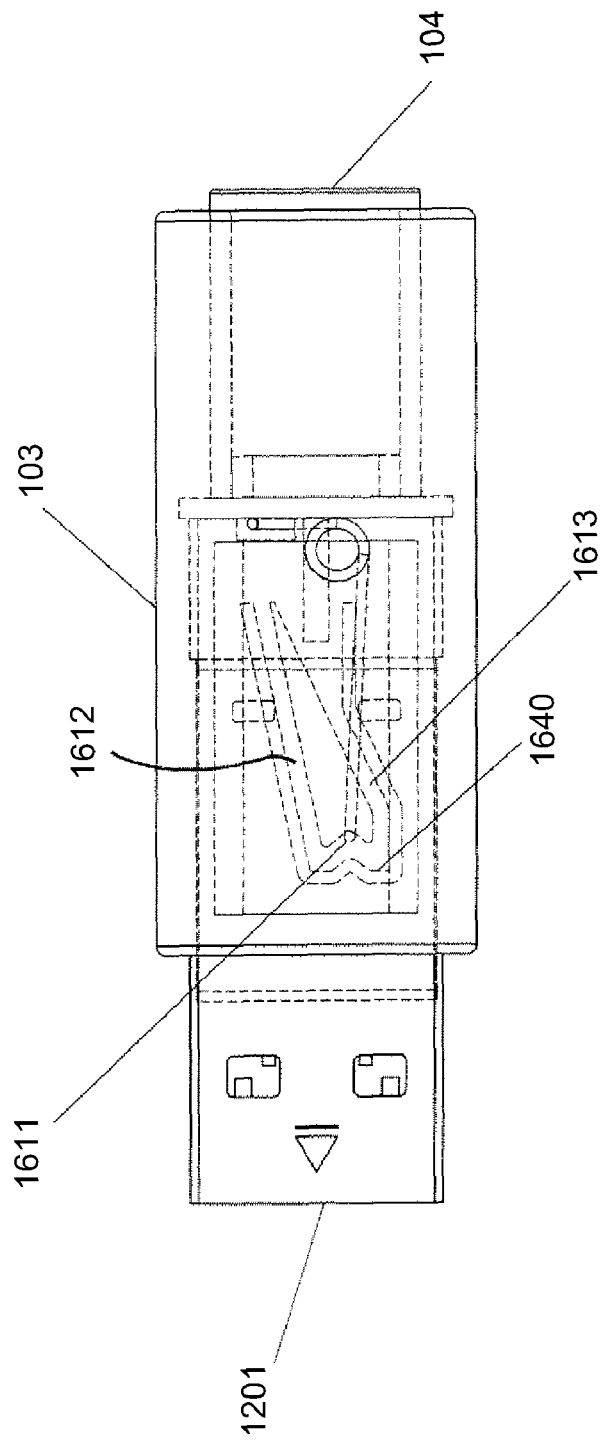
FIGS. 19A-19B show a USB drive pen device in a deployed and retracted modes according to another embodiment.
Figure 19B:
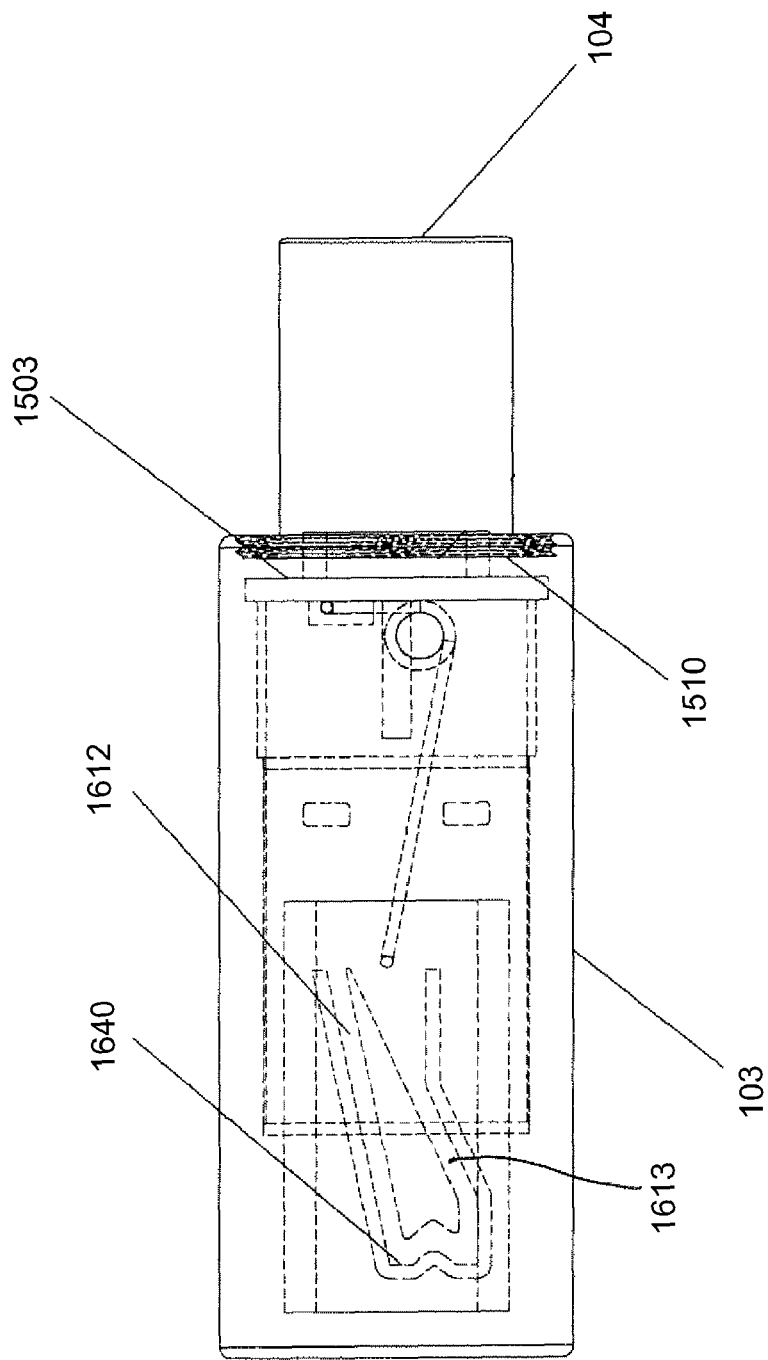

FIGS. 19A-19B are diagrams illustrating examples of deploying and retracting mechanisms of a pen-shape USB drive according to one embodiment of the invention. Referring to FIGS. 19A-19B, when a user presses button 104 to deploy the USB plug 1201 causing sub assembly 1802 (e.g., COB USB flash drive) moving forward inside sub assembly 1801 (e.g., housing) and because the spring clip 1504 is attached to sub assembly 1802 therefore the front tip 1621 is pushed forward to travel inside deploying path 1613 of the upper tray. Spring 202 meanwhile is on the opposite side of the spring clip 1504 being compressed between the container of the lower tray and protrusion of the end cap 207 during deploying motion of sub assembly 1802. When the front tip hits wall 1640 of deploying path 1613 (e.g., end of forward motion), the user feels it and releases pressing the button 104, spring 202 automatically enforces pressure to push backward sub assemble 1802 inside housing 103, the front tip 1621 travels backward a short distance and stops at lock groove 1611 of the upper tray. At deployed locked position, the front tip 1621 is locked in the lock groove 1611 of the upper tray as shown in FIG. 19A.

During retraction as shown in FIG. 19B, to release deployed locking position, the user presses button 104 again, the front tip 1621 travels forward a short distance then hit the wall 1640 of retracting path 1612, the user feels it and releases pressing the button 104, spring 202 automatically enforces pressure to push backward sub assembly 1802 all the way back inside housing 103. The front tip 1621 travels backward out of retracting path 1612. At retracted lock position, the end stop surface 1503 of end cap is pressed against the end stop surface 1510 of end stop ring. Other configurations may exist.

Thus, USB flash drive pen in addition to provide standard USB flash drive, the mechanical design is clearly for high-volume, low-cost, easy to fabricate, and manufacturing ability for manufacturer. The fashion outlook and colorful pen intends to draw attention, curiosity and attraction to users. With a distinctively deploying and retracting functions and cute outlook, the new USB flash drive pen has many advantage features. It feel light, smooth, and comfortable when a user holds it because the case and cover material are plastic. The pen is short that user could easily put it into user dress's pocket. In use, it is more like a pen such that a user does not have to open the cover, simply pressing the end button for deploying and retracting the USB plug connector.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A universal serial bus (USB) flash drive pen device, comprising:
    a USB plug assembly having a flash controller and a flash memory device;
    a pusher assembly including a rotator having one or more tabs disposed thereon; and
    a housing for housing at least a portion of the USB plug assembly and the pusher assembly, the housing having a tunnel and an inner tube extended from the tunnel disposed within the housing, wherein an intersection between the tunnel and the inner tube includes one or more angled corners,
    wherein when the USB plug assembly is deployed, the pusher assembly is pushed from a back end of the housing to deploy the USB plug assembly through a front end of the housing, wherein the rotator travels forward through the tunnel into the inner tube until tips of the one or more tabs of the rotator past the intersection of the tunnel and inner tube upon which, the tips of the one or more tabs of the rotator are interlocked with the angled corners of the intersection to maintain the USB plug assembly in a deployed position, and
    wherein when the USB plug assembly is retracted by pressing the pusher assembly again, the rotator rotates causing the tips of the tabs of the rotator to be unlocked from the angled corners of the intersection upon which, the rotator travels backward from the inner tube through the tunnel towards the back end of the housing, which in turn retracts the USB plug assembly into the housing.

2. The device of claim 1, wherein the USB plug assembly comprises:
    a USB plug connector having the flash controller and flash memory device therein; and
    an end cap for holding the USB plug assembly, the end cap having a spring container having a spring disposed therein and a pusher surface pushed by the rotator,
    wherein the end cap is pushed by the rotator which in turn pushes the USB plug connector through an opening of a front cap of the housing, the spring is compressed within the spring container of the end cap against the front cap of the housing, and
    wherein when the USB plug assembly is retracted, the spring is released to push the USB plug assembly backward towards the back end of the housing, retracting the USB plug connector through the opening of the end cap to be enclosed within the housing.

3. The device of claim 2, wherein during deploying the USB plug connector, the tips of the tabs of the rotator are pushed past the intersection of the inner tube and tunnel upon which when released, the spring pushes the end cap against the front cap of the housing which in turn pushes the tips of tabs of the rotator backward to interlock with the angled corners of the intersection.

4. The device of claim 3, wherein when the rotator is pushed and released again from the deployed position, the spring is compressed and pushes the end cap which in turn pushes and causes the rotator to rotate within the inner tube which unlocks the tips of the tabs of the rotator from the angled corners of the intersection, and wherein the rotated rotator is aligned with the tunnel and travels backwardly through the tunnel and the spring further pushes the end cap which in turn pulls the USB plug connector into the housing through the opening of the front cap.

5. The device of claim 4, wherein the tunnel comprises one or more grooves, wherein the rotator can only travel within the tunnel when the tabs of the rotator are aligned the grooves of the tunnel, wherein when the tips of the tabs of the rotator are interlocked with the angled corners of the intersection, the tabs of the rotator are not aligned with the grooves of the tunnel, and wherein during retracting the USB plug connector, the rotator is pushed and the spring causes the rotator to rotate which in turn realigns the tabs of the rotator with the grooves of the tunnel to enable the rotator to travel backward through the tunnel.

6. The device of claim 1, wherein the pusher assembly further comprises:
    a button in a cylindrical shape, the button having a close end, an open end, and a channel formed by bending a wall of button inwardly;
    a pusher rod disposed within the channel and pushed by the close end of the button, wherein the pusher rod, when pressing the close end of the button, pushes the rotator through the tunnel and the inner tube to deploy the USB plug assembly; and
    an end stop ring to be disposed on the back end of the housing, wherein the end stop ring is configured to stop the button from being completely pushed out of the housing during retracting the USB plug assembly.

7. The device of claim 6, wherein the tunnel is in a longitudinal tube shape disposed on an inner wall of the housing, wherein the channel of the button has a relatively half circle cross section having a diameter slightly larger than a diameter of the tunnel, and wherein when the button is pressed and travels within the housing, the channel of the button slides on the top of the tunnel while the pusher rod slides within the tunnel of the housing.

8. The device of claim 7, wherein the rotator includes a front end having an alignment hole to align with an alignment pin disposed on the USB plug assembly when the rotator pushes the USB plug assembly, wherein the rotator further includes a back end having an alignment pin to align with an alignment hole disposed on a front end of the pusher rod when the pusher rod pushes the rotator.

9. A universal serial bus (USB) flash drive pen device, comprising:
    a USB plug assembly having a flash controller and a flash memory device;
    a pusher assembly including a block having a tab disposed thereon; and
    a housing for housing at least a portion of the USB plug assembly and the pusher assembly, the housing having a chamber disposed on an inner wall of the housing, and the chamber having a deployed angled corner and a retracted angled corner disposed therein,
    wherein when the USB plug assembly is deployed, the block is pushed forward through the chamber, which in turn pushes the USB plug assembly to be deployed through a front end of the housing, wherein the tab of the block is interlocked with the deployed angled corner of the chamber to maintain the USB plug assembly in a deployed position, and
    wherein when the USB plug assembly is retracted, the tab of the block is unlocked from the deployed angled corner and pushed backward towards to the back end of the housing which in turn retracts the USB plug assembly into the housing, wherein the tab of the block is interlocked with a retracted angled corner of the chamber to maintain the USB plug assembly in a retracted position.

10. The device of claim 9, wherein the USB plug assembly comprises:
   a USB plug connector having the flash controller and flash memory device therein; and
   an end cap for holding the USB plug assembly, the end cap having a spring container having a spring disposed therein and a pusher rod pushed by the block,
   wherein the end cap is pushed by the block which in turn pushes the USB plug connector through an opening of a front cap of the housing, the spring is compressed within the spring container of the end cap against the front cap of the housing, and
   wherein when the USB plug assembly is retracted, the spring is released to push the USB plug assembly backward towards the back end of the housing, retracting the USB plug connector through the opening of the end cap to be enclosed within the housing.

11. The device of claim 10, wherein the deployed angled corner is disposed on first wall of the chamber and the retracted angled corner is disposed on a second wall of the chamber opposite to the first wall, wherein the block includes a first tab interlocked with the deployed angled corner when the USB plug assembly is in the deployed position and the block includes a second tab interlocked with the retracted angled corner when the USB plug assembly is in the retracted position.

12. The device of claim 11, wherein the block includes a front end having a recess, which when pushed forward through the chamber and engaged with the pusher rod of the end cap during deploying the USB plug assembly, causes a back end of the block to tilt towards the first wall of the chamber such that the first tab of the block interlocks with the deployed angled corner.

13. The device of claim 12, wherein when the USB plug assembly is retracted, the pusher rod of the end cap is pushed by the spring backward and engaged with the recess of the block, causing the back end of the block to tilt towards the second wall of the chamber such that the second tab of the block interlocks with the retracted angled corner.

14. The device of claim 13, wherein the chamber of the housing and the block have a relatively rectangular cross section, wherein the second wall is a top wall of the chamber and the first wall is a bottom wall of the chamber, wherein when the USB plug assembly is in a deployed position, the back end of the block tilts downwardly such that the first tab of the block interlocks with the deployed angled corner disposed on the bottom wall of the chamber, and wherein when the USB plug assembly is in a retracted position, the back end of the block tilts upwardly such that the second tab of the block interlocks with the retracted angled corner disposed on the top wall of the chamber.

15. The device of claim 9, wherein the pusher assembly further comprises:
   a button in a cylindrical shape, the button having a close end, an open end, and a channel formed by bending a wall of button inwardly;
   a pusher rod disposed within the channel and pushed by the close end of the button, wherein the pusher rod, when pressing the close end of the button, pushes the block through the chamber to deploy the USB plug assembly; and
   an end stop ring to be disposed on the back end of the housing, wherein the end stop ring is configured to stop the button from being completely pushed out of the housing during retracting the USB plug assembly.

16. The device of claim 15, wherein the chamber is disposed on an inner wall of the housing, wherein the channel of the button is an open channel, and wherein when the button is pressed and travels within the housing, the channel of the button slides on the top of the chamber, enclosing a top half of an outer wall of the chamber, while the pusher rod slides within the chamber of the housing.

17. A universal serial bus (USB) flash drive pen device, comprising:
   a USB plug assembly having a flash controller and a flash memory device;
   an end cap for holding the USB plug assembly, the end cap including a pusher segment and a support segment extended from the pusher segment, wherein the USB plug assembly is securely disposed on the support segment;
   a spring clip having a center ring, a first arm extended from the center ring, and a second arm extended from the center ring, the first arm ended with an end tip and the second arm ended with a front tip; and
   a housing for housing at least a portion of the USB plug assembly and the end cap, the housing having one or more tracks to form a deployed path, a retracted path, and a lock groove therein,
   wherein when the USB plug assembly is deployed, the pusher segment of the end cap is pushed forward causing the front tip of the spring clip traveling forward within the deployed path to deploy the USB plug assembly through a front end of the housing while the end tip is secured on a surface of the end cap, wherein the front tip of the spring clip is interlocked with the lock groove to maintain the USB plug assembly in a deployed position, and
   wherein when the USB plug assembly is retracted, the pusher segment of the end cap is pushed again causing the front tip of the spring clip traveling backward within the retracted path while the end tip is secured on the surface of the end cap to retract the USB plug assembly from the front end of the housing.

18. The device of claim 17, wherein the pusher segment of the end cap comprises:
   an end tip hole disposed on a top surface of the pusher segment;
   a slot disposed on the top surface of the pusher segment and extended from the end tip hole; and
   a post disposed on the top surface of the pusher segment, wherein the end tip of the spring clip is tilted downwardly and inserted into the end tip hole while the first arm and the center ring of the spring clip secured in the slot and the post respectively, during deployment and retraction of the USB plug assembly during which the front tip of the spring clip travels in the deployed path and the retracted path.

19. The device of claim 18, further comprising a top tray disposed in side of the housing, the top tray having one or more grooves to define the deployed path and the retracted path, the top tray covering the top surface of the end cap and enclosing the spring clip therein, wherein the front tip of the spring clip is tilted upwardly traveling within the deployed path or the retracted path.

20. The device of claim 19, further comprising a bottom tray, in conjunction with the top tray, to sandwich the USB plug assembly and the end cap, wherein the bottom tray includes a spring container to contain a spring therein.

21. The device of claim 19, wherein the end cap further comprises an end stop piece attached to a back end of the pusher segment, the end stop piece having a back surface facing backwardly to receive a force to push the end cap, the end stop piece having a front surface with a spring protrusion disposed thereon, wherein the spring is disposed on the spring protrusion and housed by the spring container of the bottom tray.

22. The device of claim 21, wherein when the USB plug assembly is deployed, the end cap holding the USB plug assembly is pushed forward while the front tip of the spring clip travels through the deployed path of the top tray and the spring is compressed and aligned by the spring protrusion between the end stop piece and an end wall of the spring container of the bottom tray, upon which when released, the spring pushes the end cap backward such that the front tip of the spring clip interlocks with the lock groove of the top tray.

23. The device of claim 22, wherein when the USB plug assembly is retracted, the end cap is pushed forward a short distance and released, the spring within the spring container of the bottom tray pushes the end cap backward, causing the front tip of the spring clip to unlock from the lock groove of the top tray and to travel backward within the retracted path of the top tray.

* * * * *